United States Patent
Lee et al.

(10) Patent No.: US 7,779,327 B2
(45) Date of Patent: Aug. 17, 2010

(54) DUAL STREAM STRUCTURE DIGITAL TELEVISION TRANSMISSION AND RECEIVING METHOD USING HYBRID OF E-8VSB, E-4VSB AND P2VSB

(75) Inventors: Jae-Young Lee, Seoul (KR); Kum-Ran Ji, Jeollanam-do (KR); Sung-Hoon Kim, Daejeon (KR); Seung-Won Kim, Daejeon (KR); Soo-In Lee, Daejeon (KR); Chieteuk Ahn, Daejeon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 809 days.

(21) Appl. No.: 10/594,467

(22) PCT Filed: Apr. 1, 2005

(86) PCT No.: PCT/KR2005/000967

§ 371 (c)(1),
(2), (4) Date: Feb. 14, 2007

(87) PCT Pub. No.: WO2006/004304

PCT Pub. Date: Jan. 12, 2006

(65) Prior Publication Data

US 2007/0222889 A1    Sep. 27, 2007

(30) Foreign Application Priority Data

| Apr. 1, 2004 | (KR) | 10-2004-0022694 |
| May 7, 2004 | (KR) | 10-2004-0032174 |
| Aug. 19, 2004 | (KR) | 10-2004-0065529 |

(51) Int. Cl.
*H03M 13/29* (2006.01)

(52) U.S. Cl. .................................. 714/755; 375/277
(58) Field of Classification Search .................. 714/792, 714/755; 375/277
See application file for complete search history.

(56) References Cited

U.S. PATENT DOCUMENTS 5,508,748 A    4/1996   Krishnamurthy et al.

(Continued)

FOREIGN PATENT DOCUMENTS

CN    1189049 A    7/1998

(Continued)

OTHER PUBLICATIONS

Kim, Seung-Won et al, "Enhanced-xVSB System Development for Mobile/Portable Reception," *Consumer Electronics*, IEEE Transactions, vol. 51, Issue 2 pp. 419-420, 2005.

*Primary Examiner*—Stephen M Baker
(74) *Attorney, Agent, or Firm*—Ladas & Parry LLP

(57) ABSTRACT

Provided are a Vestigial Side Band (VSB) Digital Television (DTV) transmitter and receiver based on the Advanced Television System Committee (ATSC) A/53, and a method thereof. The present invention provides 8-VSB DTV transmitter and receiver that can improve reception performance of the receiver by transmitting and receiving robust data mixed with P-2VSB, E-4VSB, and/or E-8VSB. The DTV transmitter includes an input means for receiving a digital video data stream including normal data and robust data; an encoding means for coding the digital video data stream into data symbols; and a transmitting means for modulating and transmitting an output signal of the encoding means, wherein the encoding means performs trellis coding on the robust data by sequentially applying a plurality of trellis coding methods.

28 Claims, 20 Drawing Sheets

U.S. PATENT DOCUMENTS

| | | | |
|---|---|---|---|
| 7,558,297 B2 * | 7/2009 | Bretl et al. | 370/535 |
| 7,570,720 B2 * | 8/2009 | Gaddam et al. | 375/341 |
| 7,577,208 B2 * | 8/2009 | Choi et al. | 375/265 |
| 7,599,348 B2 * | 10/2009 | Kang et al. | 370/350 |

FOREIGN PATENT DOCUMENTS

| | | | |
|---|---|---|---|
| KR | 1020040063779 A | 7/2004 | |
| WO | WO 02/080559 A2 | 10/2002 | |
| WO | 02/100026 A1 | 12/2002 | |
| WO | WO 03/003747 A1 | 1/2003 | |

\* cited by examiner

DUAL STREAM STRUCTURE DIGITAL TELEVISION TRANSMISSION AND RECEIVING METHOD USING HYBRID OF E-8VSB, E-4VSB AND P2VSB

TECHNICAL FIELD

The present invention relates to a Vestigial Side Band (VSB) digital television (DTV) transmitter and receiver based on terrestrial DTV Standards, which is A/53 of the Advanced Television System Committee (ATSC), and a method thereof. More particularly, it relates to a DTV transmitter and receiver having a mixed double stream structure, and a method thereof.

BACKGROUND ART

The standards of the Advanced Television System Committee (ATSC) suggest to use a signal obtained by modulating 12 independent data streams, which are trellis encoded and time-multiplexed, into 10.76 MHz-rate 8-level Vestigial Side Band (VSB) symbol streams to transmit High Definition Television (HDTV) broadcasting through a terrestrial broadcasting channel. The frequency band of the signal is transformed into a frequency band of 6 MHz which corresponds to a standard Very High Frequency (VHF) or Ultrahigh Frequency (UHF) terrestrial television channel. Signals of the corresponding channel are broadcasted at a data rate of 19.39 Mbps. Detailed technology on the ATSC DTV standards and A/53 are available at http://www.atsc.org/.

FIG. 1 is a block diagram showing a conventional DTV transmitter. As shown, data inputted into a transmitter 100 are serial data streams formed of 188-byte Moving Picture Experts Group (MPEG) compatible data packets, each of which includes a synchronous byte and 187-byte payload data. The inputted data are randomized in a data randomizer 101 and each packet is encoded to include 20-byte parity information for forward error correction (FEC), FEC-Reed Solomon (RS) coding, 1/6 data field interleaving, and 2/3 trellis coding.

That is, according to the ATSC standards, the data randomizer 101 performs XOR on the payload data bytes and a pseudo random binary sequence (PRBS) having a maximum length of 16 bits, which is initialized at a starting field of a data field.

In the RS encoder 103 receiving the outputted randomized data, data having a total of 207 bytes are generated for each data segment by adding 20 RS parity bytes for FEC to the 187 bytes.

The randomization and FEC are not performed on synchronous bytes corresponding to a segment synchronous signal among the inputted packet data.

Subsequently, data packets included in consecutive segments of each field are interleaved in a data interleaver 105, and the interleaved data packets are interleaved again and encoded in a trellis encoder 107. The trellis encoder 107 generates a stream of a data symbol expressed in three bits by using two inputted bits. One bit of the inputted two bits is pre-coded and the other bit is 4-state trellis encoded into two bits. The three bits finally outputted are mapped to an 8-level symbol. The trellis encoder 107 includes 12 parallel trellis encoders and precoders to generate 12 interleaved/coded data sequences.

The 8-level symbol are combined in a multiplexer (MUX) 109 with segment and field synchronization bit sequences 117 from a synchronization unit (not shown) to form a transmission data frame. Subsequently, a pilot signal is added in a pilot adder 111. Symbol streams go through VSB suppressed-carrier modulation in a VSB modulator 113. An 8-VSB symbol stream of a baseband is finally converted into a radio frequency (RF) signal in an RF converter 115 and then transmitted.

FIG. 2 is a block diagram describing a conventional DTV receiver 200. As illustrated, a channel for the RF signal transmitted from the transmitter 100 is selected in a tuner 201 of the receiver 200. Then, the RF signal goes through intermediate frequency (IF) filtering in an IF filter and detector 203 and a synchronous frequency is detected. A synchronous (sync) and timing recovery block 215 detects a synchronous signal and recovers a clock signal.

Subsequently, a National Television Systems Committee (NTSC) interference signal is removed from the signal through a comb filter in an NTSC filter 205, and equalized and phase-tracked in an equalizer and phase tracker 207.

An encoded data symbol removed of multi-path interference goes through trellis decoding in a trellis decoder 209. The decoded data symbol is deinterleaved in a data deinterleaver 211. Subsequently, the data symbol is RS decoded in an RS decoder 213 and derandomized in a data derandomizer 217. This way, the MPEG compatible data packet transmitted from the transmitter 100 can be restored.

FIG. 3 is a diagram illustrating a transmission data frame exchanged between the transmitter of FIG. 1 and the receiver of FIG. 2. As illustrated in the drawing, a transmission data frame includes two data fields and each data field is formed of 313 data segments.

The first data segment of each data field is a synchronous signal, i.e., a data field synchronous signal, which includes a training data sequence used in the receiver 200. The other 312 data segments include a 188-byte transport packet and 20-byte data for FEC, individually. Each data segment is formed of data included in a couple of transmission packets due to data interleaving. In other words, the data of each data segment correspond to several transmission packets.

Each data segment is formed of 832 symbols. The first four symbols are binary and they provide data segment synchronization. A data segment synchronous signal corresponds to a synchronous byte, which is the first byte among the 188 bytes of the MPEG compatible data packet. The other 828 symbols correspond to 187 bytes of the MPEG compatible data packet and 20 bytes for FEC. The 828 symbols are transmitted in the form of an 8-level signal, and each symbol is expressed in three bits. Therefore, 2,484 bits (=828 symbols×3 bits/symbol) are transmitted per data segment.

However, transmission signals of a conventional 8-VSB transceiver are distorted in indoor and mobile channel environments due to variable channel and multipath phenomena, and this degrades reception performance of the receiver.

In other words, transmitted data are affected by various channel distortion factors. The channel distortion factors include a multipath phenomenon, frequency offset, phase jitter and the like. To compensate for the signal distortion caused by the channel distortion factors, a training data sequence is transmitted every 24.2 ms, but a change in multipath characteristics and Doppler interference exist even in the time interval of 24.2 ms that the training data sequences are transmitted. Since an equalizer of the receiver does not have a convergence speed fast enough to compensate for the distortion of receiving signals, which occurs by the change in multipath characteristics and the Doppler interference, the receiver cannot perform equalization precisely.

For this reason, the broadcasting program reception performance of 8-VSB DTV broadcast is lower than that of an analog broadcast and reception is impossible in a mobile receiver. Even if reception is possible, there is a problem that a signal-to-noise ratio (SNR) satisfying Threshold of Visibility (TOV) increases.

To solve the problems, International publication Nos. WO 02/080559 and WO 02/100026, and U.S. Patent publication No. US2002/019470 disclose technology for transmitting robust data to any one among 4-level symbols, e.g., {−7,−5, 5,7} or {−7,−3,3,7}, the technology which will be referred to as P-2VSB. Since the symbols to which robust data are mapped are limited in the conventional technology, there is a problem that the average power of the symbols corresponding to the robust data is increased compared to conventional 8-VSB method. In other words, when robust data are transmitted to any one among four level symbols {−7,−5,5,7}, symbol average power is 37 energy/symbol, or if robust data are transmitted to any one among four level symbols {−7,−3, 3,7}, symbol average power is 29 energy/symbol, which signifies that the average power of the symbol corresponding to the robust data is increased compared to the conventional 8-VSB method. The increase in the symbol average power leads to increase in the entire average power. When signals are transmitted with a limited transmission power, which is true in most cases, the transmission power of normal data are relatively reduced compared to the conventional 8-VSB method and, thus, there is a problem that the normal data have poorer reception performance than the conventional 8-VSB method in the same channel environment.

Since the problem becomes more serious when the ratio of robust data mixed with normal data is increased, the SNR satisfying the TOV is increased. Accordingly, the reception performance is degraded, even though the channel environment is fine and it is likely to happen that backward compatibility cannot be provided for an 8-VSB receiver.

Also, Korean Patent Application No. 2003-0000512 discloses a technology for transmitting robust data to any one of four-level symbols {−7,−1,3,5} or {−5,−3,1,7}, which will be referred as E-4VSB hereafter.

The E-4VSB method does not have the problem that the average power is increased. However, since the free distance of a trellis encoder that determines the performance of robust data is not large compared to 6 of the conventional standard 8-VSB, the performance may be less improved than the P-2VSB method in an Additive White Gaussian Noise (AWGN) channel environment.

Also, Korean Patent Application No. 2004-0022688 discloses a technology for transmitting robust data to any one of 8-level symbol {−7,−5,−3,−1,1,3,5,7}, which will be referred to as E-8VSB hereafter.

Since the E-8VSB method uses 8 levels {−7,−5,−3,−1,1,3, 5,7} which is the same as the conventional 8-VSB, it may have inferior performance to the P-2VSB in a multi-path channel.

DISCLOSURE

Technical Problem

It is, therefore, an object of the present invention, which is developed to resolve the problems, to provide a Digital Television (DTV) transmitter and receiver that can improve reception performance by transmitting and receiving robust data in which P-2 Vestigial Side Band (VSB), E-4VSB, and/or E-8VSB, and a method thereof.

The other objects and advantages of the present invention can be easily recognized by those of ordinary skill in the art of the present invention from the drawing, detailed description, and claims of the present specification.

Technical Solution

In accordance with one aspect of the present invention, there is provided a digital television (DTV) transmitter, which includes: an input unit for receiving a digital video data stream including normal data and robust data; an encoding unit for coding the digital video data stream into data symbols; and a transmitting unit for modulating and transmitting an output signal of the encoding unit, wherein the encoding unit performs trellis coding on the robust data by mixing several methods.

In accordance with another aspect of the present invention, there is provided a DTV receiver, which includes: a receiving unit for receiving a transmission signal including normal data and robust data and converting the received transmission signal into a baseband signal; an equalizing unit for determining a symbol level of the transmission signal; a trellis decoding unit for performing trellis decoding on the symbol whose level has been determined; and a decoding unit for outputting a digital video data stream with respect to the trellis decoded signal, wherein the trellis decoding unit performs trellis decoding on the robust data by mixing several methods.

In accordance with another aspect of the present invention, there is provided a DTV transmitting method, which includes the steps of: a) inputting a digital video data stream including normal data and robust data; b) coding the digital video data stream into data symbols; and c) modulating and transmitting an output signal of the encoding step b), wherein trellis coding is performed on the robust data by mixing several methods in the encoding step b).

In accordance with another aspect of the present invention, there is provided a DTV receiving method, which includes the steps of: a) receiving a transmission signal including normal data and robust data and converting the received transmission signal into a baseband signal; b) determining a symbol level of the transmission signal; c) performing trellis decoding on the symbol whose level has been determined; and d) outputting a digital video data stream with respect to the trellis decoded signal, wherein trellis decoding is performed on the robust data by mixing several methods in the trellis decoding step c).

In accordance with another aspect of the present invention, there is provided a DTV transmission signal, which includes: normal data mapped to any one data symbol of {−7,−5,−3,−1,1,3,5,7}; robust data which are trellis coded in P-2VSB, E-4VSB, and/or E-8VSB and mapped to any one data symbol of {−7,−5,−3,−1,1,3,5,7}; information about the robust data trellis coding method; and a robust data flag for identifying the normal data and the robust data.

In accordance with the present invention, normal data are transmitted in the 8-VSB method and robust data go through 16-state trellis coding. That is, when part of 312 data segments of a data field are replaced with robust data which are trellis coded in P-2VSB, E-4VSB, or E-8VSB instead of normal data packets, the preciseness of error signal calculation for updating a tap coefficient of an equalizer for the transmitted robust data in the receiver and the preciseness of a trellis decoder are improved. Thus, reception performance of the normal data is improved and the SNR of the robust data is reduced.

Advantageous Effects

As described above, the present invention can reduce a signal-to-noise ratio (SNR) satisfying a Threshold of Visibility (TOV) by mixing robust data coded in P-2VSB, E-8VSB, and/or E-8VSB methods with normal data following the 8-VSB method and thus improving reception performance with respect to normal data as well as robust data.

Also, broadcasting stations can transmit robust data adaptively by coding robust data in an appropriate method based on a specific usage and required robustness.

DESCRIPTION OF DRAWINGS

The above and other objects and features of the present invention will become apparent from the following description of the preferred embodiments given in conjunction with the accompanying drawings, in which.

BEST MODE FOR THE INVENTION

Figure 1:
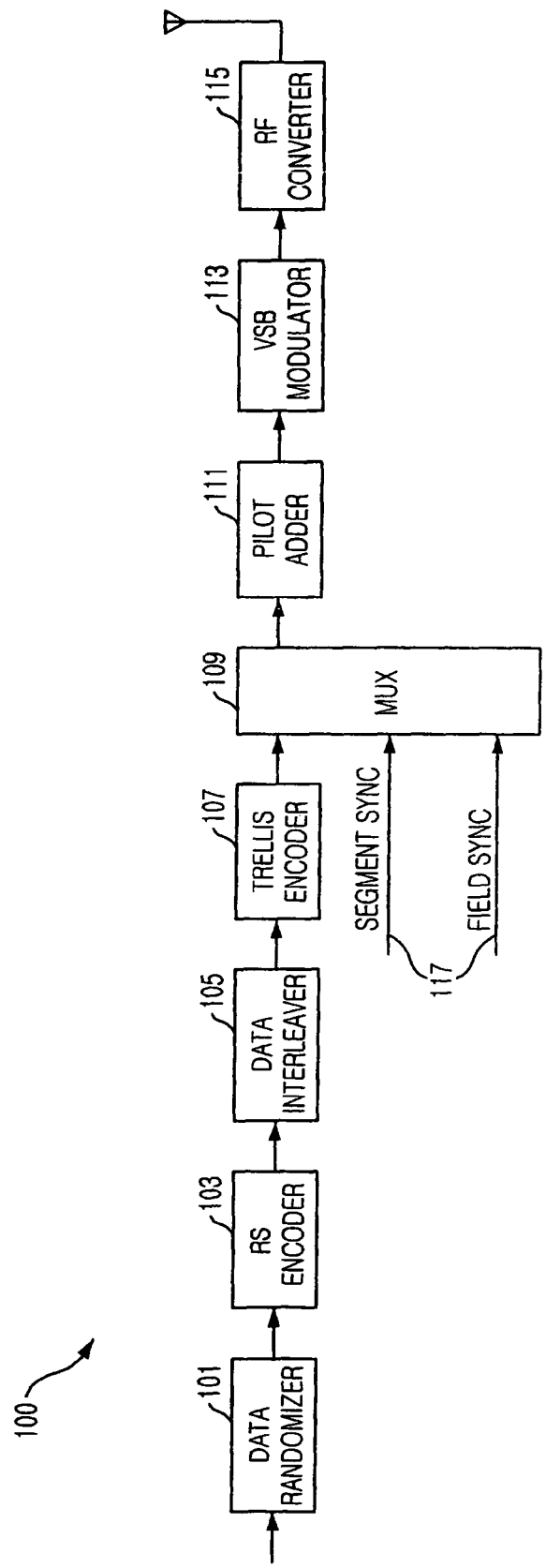
FIG. 1 is a block diagram showing a conventional Digital Television (DTV) transmitter.
Figure 2:
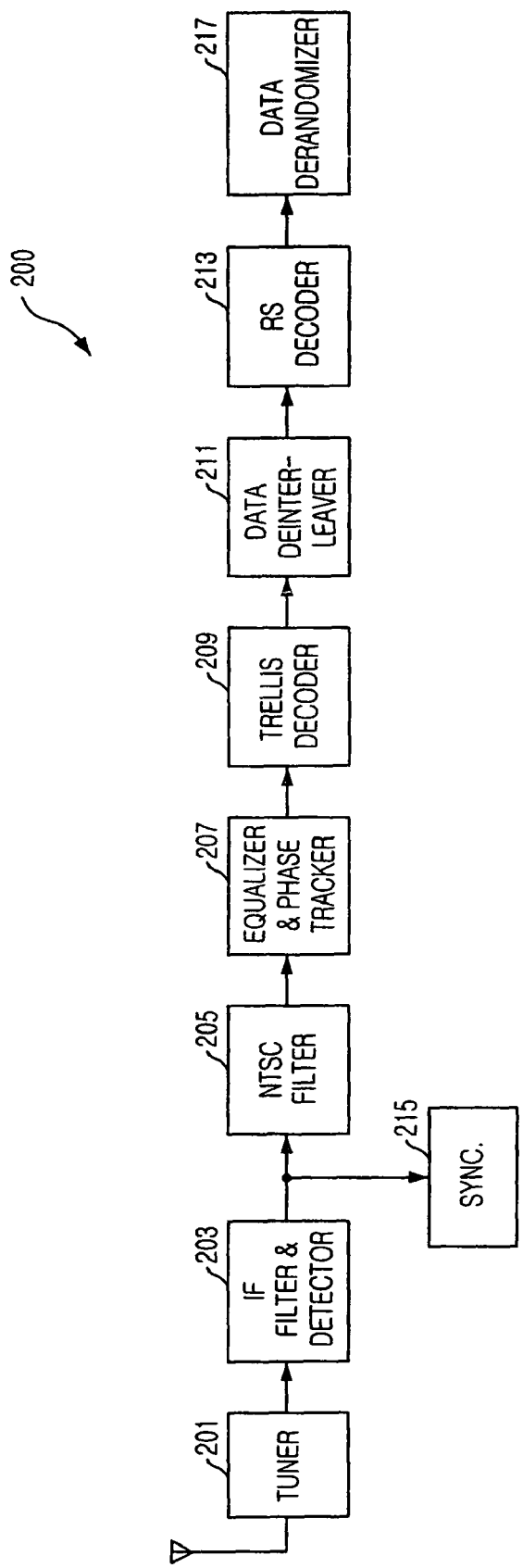
FIG. 2 is a block diagram illustrating a conventional DTV receiver.
Figure 3:
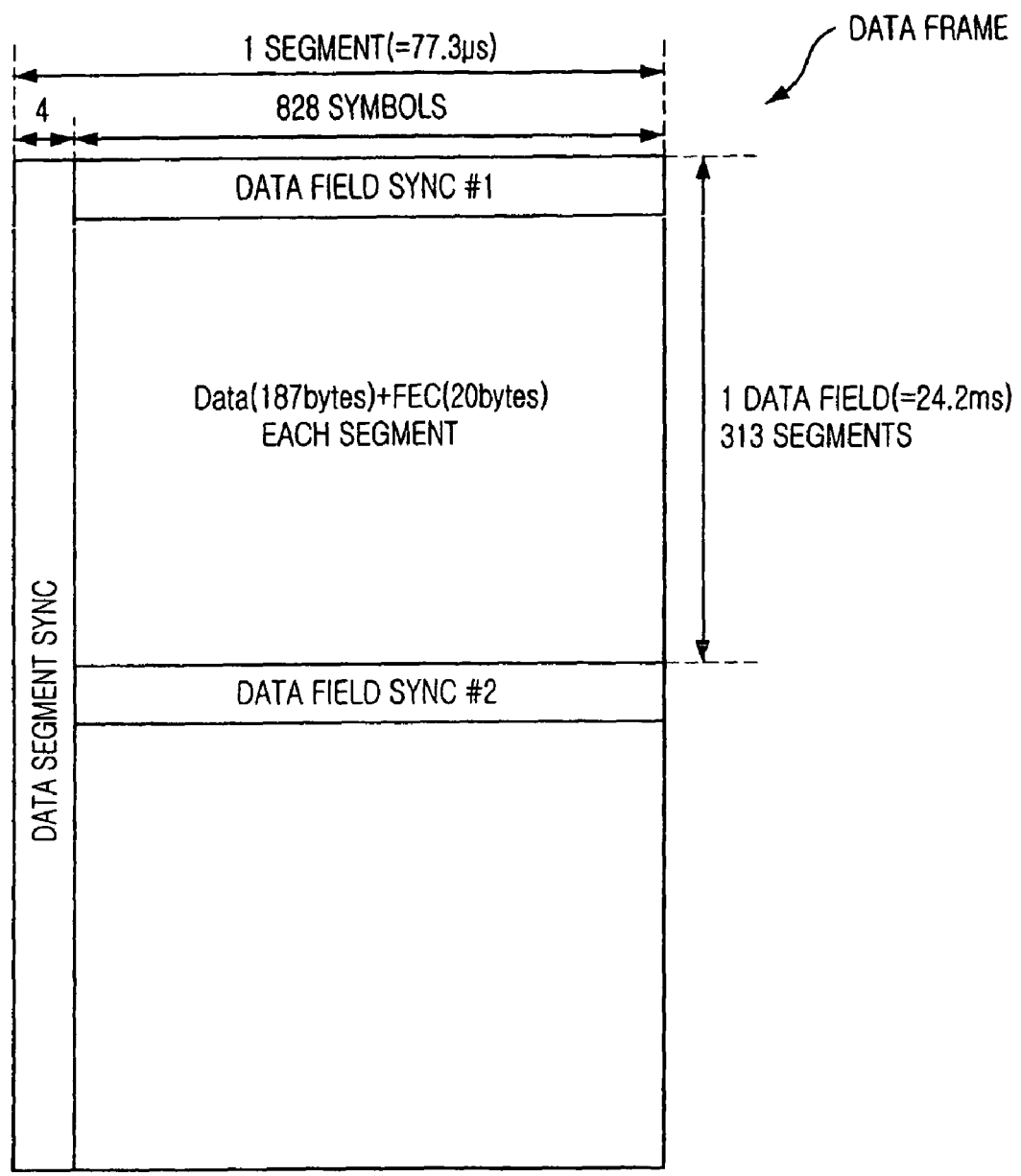
FIG. 3 is a diagram describing a transmission data frame exchanged between the transmitter of FIG. 1 and the receiver of FIG. 2.

The following description exemplifies only the principles of the present invention. Even if they are not described or illustrated clearly in the present specification, one of ordinary skill in the art can embody the principles of the present invention and invent various apparatuses within the concept and scope of the present invention.

The use of the conditional terms and embodiments presented in the present specification are intended only to make the concept of the present invention understood, and they are not limited to the embodiments and conditions mentioned in the specification.

In addition, all the detailed description on the principles, viewpoints and embodiments and particular embodiments of the present invention should be understood to include structural and functional equivalents to them. The equivalents include not only currently known equivalents but also those to be developed in future, that is, all devices invented to perform the same function, regardless of their structures.

For example, block diagrams of the present invention should be understood to show a conceptual viewpoint of an exemplary circuit that embodies the principles of the present invention. Similarly, all the flowcharts, state conversion diagrams, pseudo codes and the like can be expressed substantially in a computer-readable media, and whether or not a computer or a processor is described distinctively, they should be understood to express various processes operated by a computer or a processor.

Functions of various devices illustrated in the drawings including a functional block expressed as a processor or a similar concept can be provided not only by using hardware dedicated to the functions, but also by using hardware capable of running proper software for the functions. When a function is provided by a processor, the function may be provided by a single dedicated processor, single shared processor, or a plurality of individual processors, part of which can be shared.

The apparent use of a term, 'processor', 'control' or similar concept, should not be understood to exclusively refer to a piece of hardware capable of running software, but should be understood to include a digital signal processor (DSP), hardware, and ROM, RAM and non-volatile memory for storing software, implicatively. Other known and commonly used hardware may be included therein, too.

Similarly, a switch described in the drawings may be presented conceptually only. The function of the switch should be understood to be performed manually or by controlling a program logic or a dedicated logic or by interaction of the dedicated logic. A particular technology can be selected for deeper understanding of the present specification by a designer.

In the claims of the present specification, an element expressed as a means for performing a function described in the detailed description is intended to include all methods for performing the function including all formats of software, such as combinations of circuits for performing the intended function, firmware/microcode and the like.

To perform the intended function, the element is cooperated with a proper circuit for performing the software. The present invention defined by claims includes diverse means for performing particular functions, and the means are connected with each other in a method requested in the claims. Therefore, any means that can provide the function should be understood to be an equivalent to what is figured out from the present specification.

Other objects and aspects of the invention will become apparent from the following description of the embodiments with reference to the accompanying drawings, which is set forth hereinafter. If it is considered that further description on the prior art may blur the points of the present invention, the description will not be provided. Hereinafter, preferred embodiments of the present invention will be described in detail with reference to the accompanying drawings.

Figure 4:
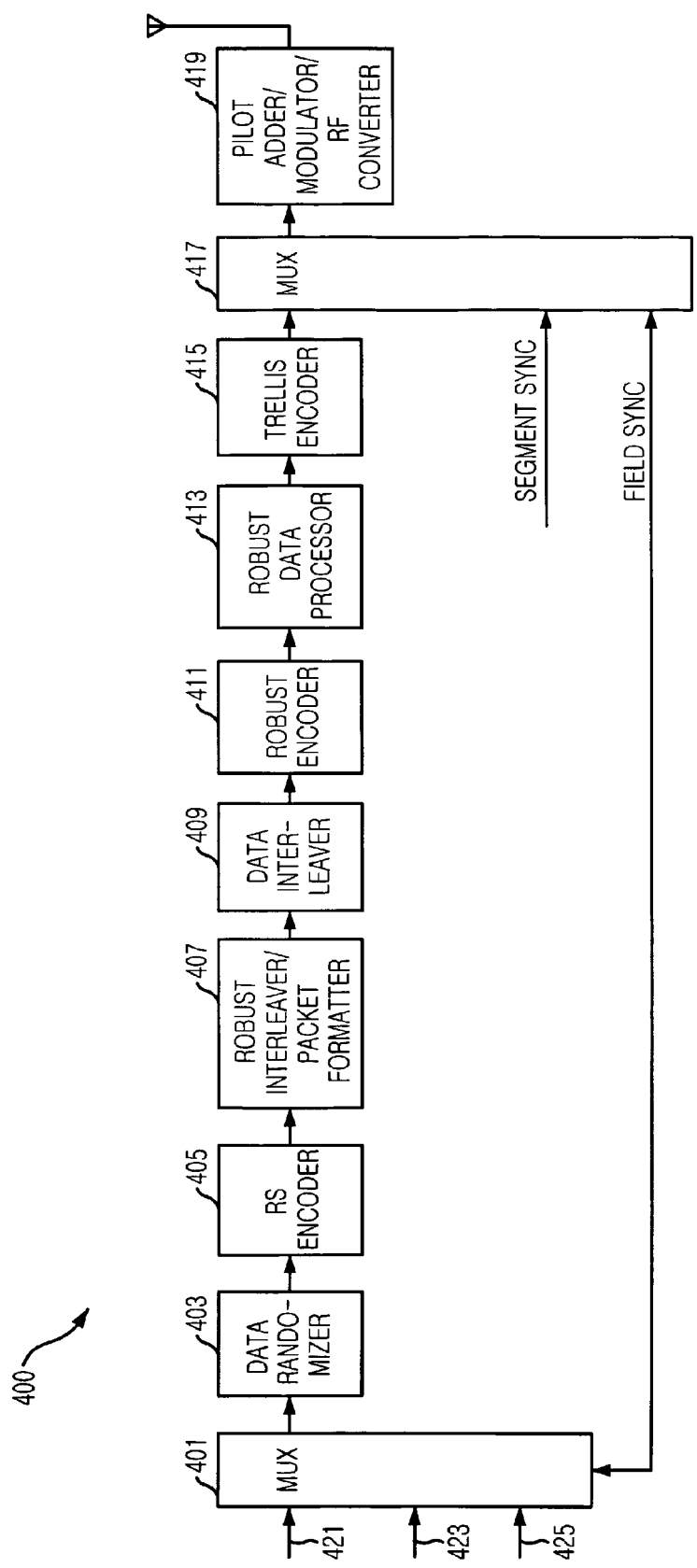
FIG. 4 is a block diagram showing a DTV transmitter in accordance with an embodiment of the present invention.

FIG. 4 is a block diagram showing a Digital Television (DTV) transmitter in accordance with an embodiment of the present invention. As shown, the transmitter 400 includes: a first multiplexer 401, a data randomizer 403, a Reed Solomon (RS) encoder 405, a robust interleaver/packet formatter 407, a data interleaver 409, a robust encoder 411, a robust data processor 413, a trellis encoder 415, a second multiplexer 417, and a pilot adder/modulator/Radio Frequency (RF) converter 419.

The data randomizer 403, the RS encoder 405, the data interleaver 409, the trellis encoder 415, the second multiplexer 417, and a pilot adder/modulator/RF converter 419 are the same as the conventional data randomizer 101, the RS encoder 103, the data interleaver 105, the trellis encoder 107, the multiplexer 109, and a pilot adder 111, the Vestigial Side Band (VSB) modulator 113, and the RF converter 115, which were described with reference to FIG. 1.

The first multiplexer 401 multiplexes a normal data packet 421 and a robust data packet 423 under the control of a robust data flag signal 425.

A normal data packet 421 and a robust data packet 423 are serial data streams formed of 188-byte Moving Picture Experts Group (MPEG) compatible data packets and they have the same attributes, but the robust data packet includes an information packet and a null packet. A null packet includes arbitrary data, for example, "0," having a null packet header and it is added to secure a packet space to be extended based on a coding rate of robust data. In the present specification, the present invention will be described based on an embodiment where the coding rate of robust data is 1/2, but the present invention should be understood that it is not limited to it.

The robust data flag signal 425 is generated in an external device (not shown) based on the ratio of robust data to normal data in a field, i.e., the Number of Robust Data Packets (NRP), and the coding rate of the robust data, e.g., 1/2 or 1/4. The other compositional elements of the transmitter 400 including the first multiplexer 401 can check out whether data processed currently by using the robust data flag signal 425 are robust data.

The first multiplexer 401 multiplexes the normal data packet 421, the robust data packet 423, and the robust data flag signal 425 based on the number of robust data packets for each field. In accordance with an embodiment, the position of a robust data packet can be defined as an equation 1 according to the number of the robust data packets.

$0 \leq NRP/2 \leq 39$: $\quad$ Eq. 1

$\{s \mid s = 4i, i = 0, 1, \ldots, NRP - 1\}, (0 \leq s \leq 156)$ $40 \leq NRP/2 \leq 78$:

$\{s \mid s = 4i, i = 0, 1, \ldots, 77\} U$ $\{s \mid s = 4i + 2, i = 0, 1, \ldots, NRP - 79\}$ $79 \leq NRP/2 \leq 117$:

$\{s \mid s = 4i, i = 0, 1, \ldots, 77\} U \{s \mid s = 4i + 2, i = 0, 1, \ldots, 77\} U$ $\{s \mid s = 4i + 1, i = 0, 1, \ldots, NRP - 157\}$ $118 \leq NRP/2 \leq 156$:

$\{s \mid s = 4i, i = 0, 1, \ldots, 77\} U$ $\{s \mid s = 4i + 2, i = 0, 1, \ldots, 77\} U \{s \mid s = 4i + 1, i = 0, 1, \ldots, 77\} U$ $\{s \mid s = 4i, i = 0, 1, \ldots, NRP - 235\}$ In the equation 1, NRP denotes the number of robust segments occupied by robust data packets for each data field, that is, the Number of Robust data Packets in a frame. As described above, the NRP is a value including all the number of information packet and null packets and it has a range of 0 to 312. Also, U signifies a union of two sets, and s denotes a data segment number in a data field and s has a range of 0 to 311.

In accordance with another embodiment, the position of a robust data packet can be defined as an equation 2.

RPI=312/NRP

RPP=floor(RPI×r) $\quad$ Eq. 2

In the equation 2, RPI stands for Robust Data Packet Interval and RPP denotes Robust Data Packet Position. Floor (*) is a decimal cutting operation, which means an operation cutting out a decimal number, for converting an arbitrary number * into an integer value, and a value r has a range of 0 to NRP.

According to the equation 2, when the NRP is 162 and the robust data coding rate is 1/2, the positions of normal data and robust data of a data field are determined as shown in Table 1.

TABLE 1

| Packet Number | Packet Type |
| --- | --- |
| 0 | robust |
| 1 | robust (null) |
| 2 | normal |
| 3 | robust |
| 4 | normal |
| 5 | robust (null) |
| 6 | normal |
| 7 | robust |
| 8 | normal |
| 9 | robust (null) |
| 10 | normal |
| 11 | robust |
| 12 | normal |
| 13 | robust (null) |
| 14 | normal |
| 15 | robust |
| ... | ... |
| 297 | normal |
| 298 | robust |
| 299 | normal |
| 300 | robust (null) |
| 301 | normal |
| 302 | robust |
| 303 | normal |
| 304 | robust (null) |
| 305 | normal |
| 306 | robust |
| 307 | normal |
| 308 | robust (null) |
| 309 | normal |
| 310 | robust (null) |
| 311 | normal |

The normal data packet 421 and the robust data packet 423 multiplexed in the first multiplexer 401 are randomized in the data randomizer 403, and each packet is encoded to include a 20-byte parity information for Forward Error Correction (FEC) in the RS encoder 405. In the RS encoder 405, data having a total of 207 bytes, which are transmitted for each data segment, are generated by adding 20 RS parity bytes for FEC to the 187-byte data. A robust data flag does not go through the randomization and RS encoding. If a robust data packet is RS encoded and 20 RS parity bytes are added, a robust data flag is marked for the added RS parity bytes.

Subsequently, the normal and robust data packets which are included in consecutive segments of each data field and RS-coded are inputted to the robust interleaver/packet formatter 407 and only robust data including information packet are interleaved based on a robust data flag. The interleaved robust data are reconstructed into a 207-byte packet according to the robust data coding rate, and the reconstructed robust data packet is multiplexed with the normal data packet. The normal data packet has a predetermined delay to be multiplexed with the robust data packet.

Figure 5:
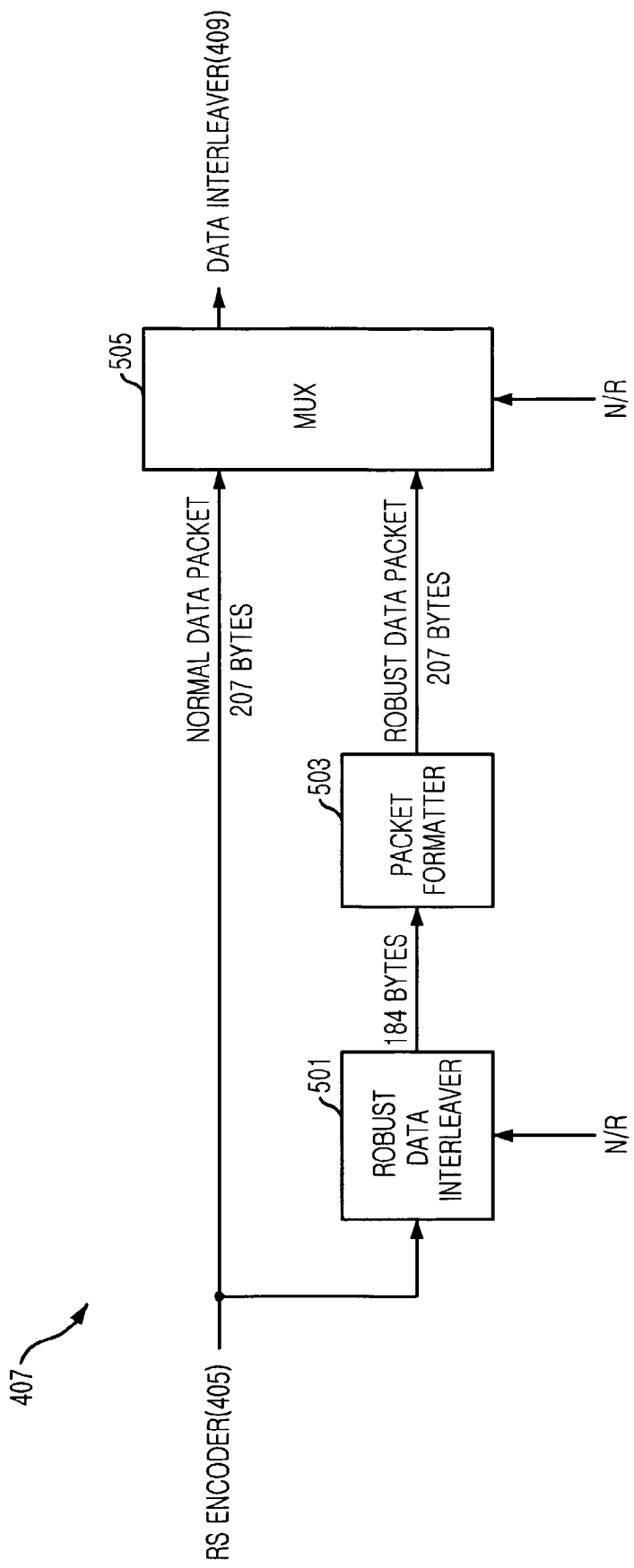
FIG. 5 is a block diagram depicting a robust interleaver and a packet formatter of FIG. 4.

FIG. 5 is a block diagram depicting a robust interleaver and a packet formatter of FIG. 4. As illustrated, the robust interleaver/packet formatter 407 includes a robust data interleaver 501, a packet formatter 503, and a third multiplexer 505.

Figure 6:
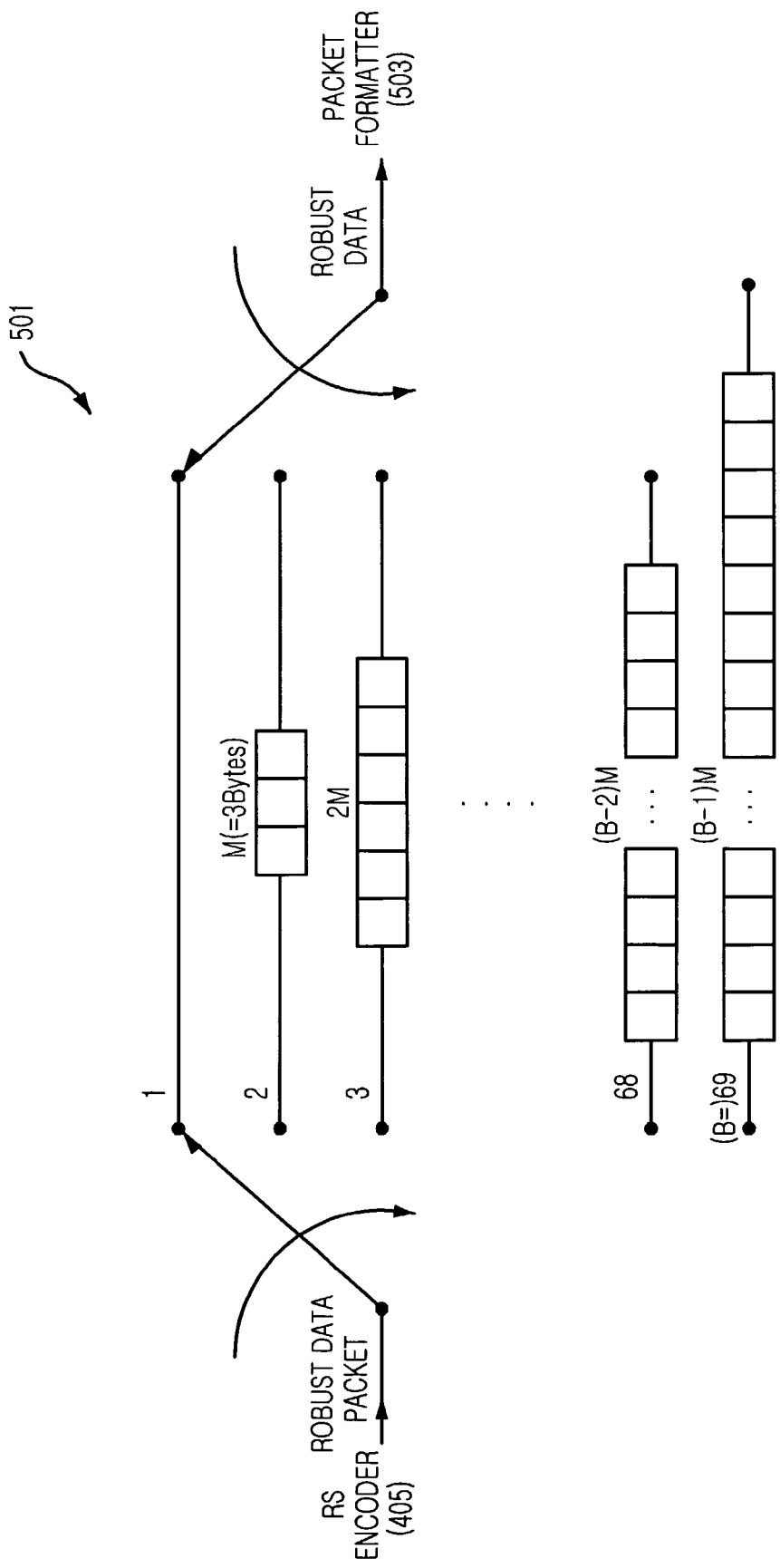
FIG. 6 is a diagram describing a robust data interleaver of FIG. 5.

The robust data interleaver 501 interleaves only a robust data packet based on a robust data flag signal. FIG. 6 is a diagram describing a robust data interleaver of FIG. 5. As shown, the robust data interleaver 501 receives signals on a byte basis with respect to a robust data packet only among data packets inputted from the RS encoder 405, performs interleaving to transmit the robust data to the packet formatter 503. Also, the robust data interleaver 501 has parameters M=3, B=69 and N=207, and forms the interleaved packet out of data from 69 different packets at maximum. Among the robust data packets, a null packet is abandoned and the interleaving is performed only on the information packets.

The packet formatter 503 shown in FIG. 5 processes the robust data interleaved in the robust data interleaver 501. The packet formatter 503 receives 184 bytes from the robust data interleaver 501 and generates two 207-byte data blocks with respect to the 184-byte robust data. Herein, four bits of each byte of the generated 207-byte data block, for example, LSB (6,4,2,0), corresponds to the inputted robust data. The other four bits, for example, MSB (7,5,3,1), are set up with arbitrary values. Meanwhile, in each of the generated 207-byte data blocks, the byte positions that do not correspond to the 184-byte robust data are filled with header-byte data or arbitrary information data to be used for RS parity bytes, which will be described later on.

Subsequently, the packet formatter 503 adds a header corresponding to a null packet to the first three bytes of each 207-byte data block. Then, the packet formatter 503 generates a 207-byte packet by adding 20 bytes, each of which is formed of arbitrary information, for example, "0," to each data block. The 20-byte arbitrary information is replaced with RS parity information in the robust data processor 413, which will be described later.

All the other vacant byte positions can be filled with bytes of the 184-byte robust data sequentially. The packet formatter 503 checks out whether a position corresponds to a parity byte position, before it adds robust data bytes to each newly generated 207-byte data block. If the position does not correspond to a parity byte, a robust data byte is placed in the position. If the position corresponds to a parity byte, the byte position is skipped and the next byte position is checked. The process is repeated until all the robust data bytes are placed in the newly generated 207-byte data block.

Therefore, if robust-interleaved four robust data packets (4×207 bytes) are inputted into the packet formatter 503, the packet formatter 503 outputs 9 packets (9×207 bytes), each of which is formed of robust data bytes, header bytes, and arbitrary information bytes for RS parity bytes. The outputted 9 packets include 92-bytes of the robust data inputted to the packet formatter 503, individually.

Meanwhile, the positions of arbitrary data bytes for RS parity bytes with respect to each packet are determined based on an equation 3.

$$m = (52 \times n + (s \bmod 52)) \bmod 207 \qquad \text{Eq. 3}$$

Herein, m denotes an output byte number, i.e., a parity byte position of a packet extended into 207 bytes; n denotes an input byte, i.e., a byte number in each packet, and it ranges from 0 to 206; s denotes a segment corresponding to robust data in a data field, i.e., a packet number, and it ranges from 0 to 311. The parity byte positions, i.e., the value m, can be calculated in the range of 187 to 206 only with respect to the value n so that the positions of 20 parity packets for each packet should correspond to the last 20 bytes of the packet. In short, the value n corresponds to the last 20 bytes of a packet.

For example, when s=0 and n is in the range of 187 to 206, the parity byte positions for a packet 0 are given as 202, 47, 99, 151, 203, 48, 100, 152, 204, 49, 101, 153, 205, 50, 102, 154, 206, 51, 103, and 155. This signifies that the parity byte position should be the $202^{nd}$ byte to make the parity byte position ranged between 187 and 206 after interleaving in the data interleaver 409. Similarly, the position of another parity byte should be the $47^{th}$ byte. However, according to the equation 3, a parity byte can be positioned in a position of a packet header byte. That is, the value m can be 0, 1 and/or 2. Therefore, in order to prevent a parity byte from being positioned in the packet header byte position, the range of the value n can be increased as many as the number of parity bytes positioned for the header position up to three. Accordingly, if a result value of s mod 52 is any one between 1 and 7 in calculation of 20 m values, part of the 20 m values becomes 0, 1 and/or 2.

For example, when s mod 52=0, all the 20 m values do not indicate header byte positions, i.e., 0, 1 or 2, and thus all the 20 m values can be used for parity byte positions.

On the other hand, when s mod 52=1, one among the 20 m values indicate 0, which is a header byte position. In this case, the range of the value n is increased by 1 to be from 186 to 206. Therefore, 21 m values are calculated and a value m that comes in the header byte position is disused. The other 20 m values are designated to parity byte positions.

Likewise, when s mod 52=2, two out of 20 m values indicate 0 and 1, which are the header byte positions. In this case, the range of n is increased by two to be from 185 to 206. Accordingly, 22 m values are calculated and the values m corresponding to the header byte positions, i.e., 0 or 1, are disused. The other 20 m values are designated to parity byte positions.

Table 2 below shows the range of the value n based on the position of a robust data segment.

TABLE 2

| s mod 52 | Number of additional m values | Range of n |
| --- | --- | --- |
| 0 | 0 | 187 to 206 |
| 1 | 1 | 186 to 206 |
| 2 | 2 | 185 to 206 |
| 3 | 3 | 184 to 206 |
| 4 | 3 | 184 to 206 |
| 5 | 3 | 184 to 206 |
| 6 | 2 | 185 to 206 |
| 7 | 1 | 186 to 206 |
| 8 to 51 | 0 | 187 to 206 |

A third multiplexer 505 of FIG. 5 multiplexes a robust data packet and a normal data packet, which are outputted from the packet formatter 503, based on a robust data flag. The operation of the third multiplexer 505 is the same as that of the first multiplexer 401.

Referring to FIG. 4 again, the data interleaver 409 interleaves data packets within consecutive segments of each data field on a byte basis to scramble the sequential order of a robust data flag and normal/robust data stream based on the ATSC A/53 standards and outputs scrambled data. The data interleaver 409 has a similar structure to the robust data interleaver 501 (see FIG. 6, M=4, B=52 and N=208).

Figure 7:
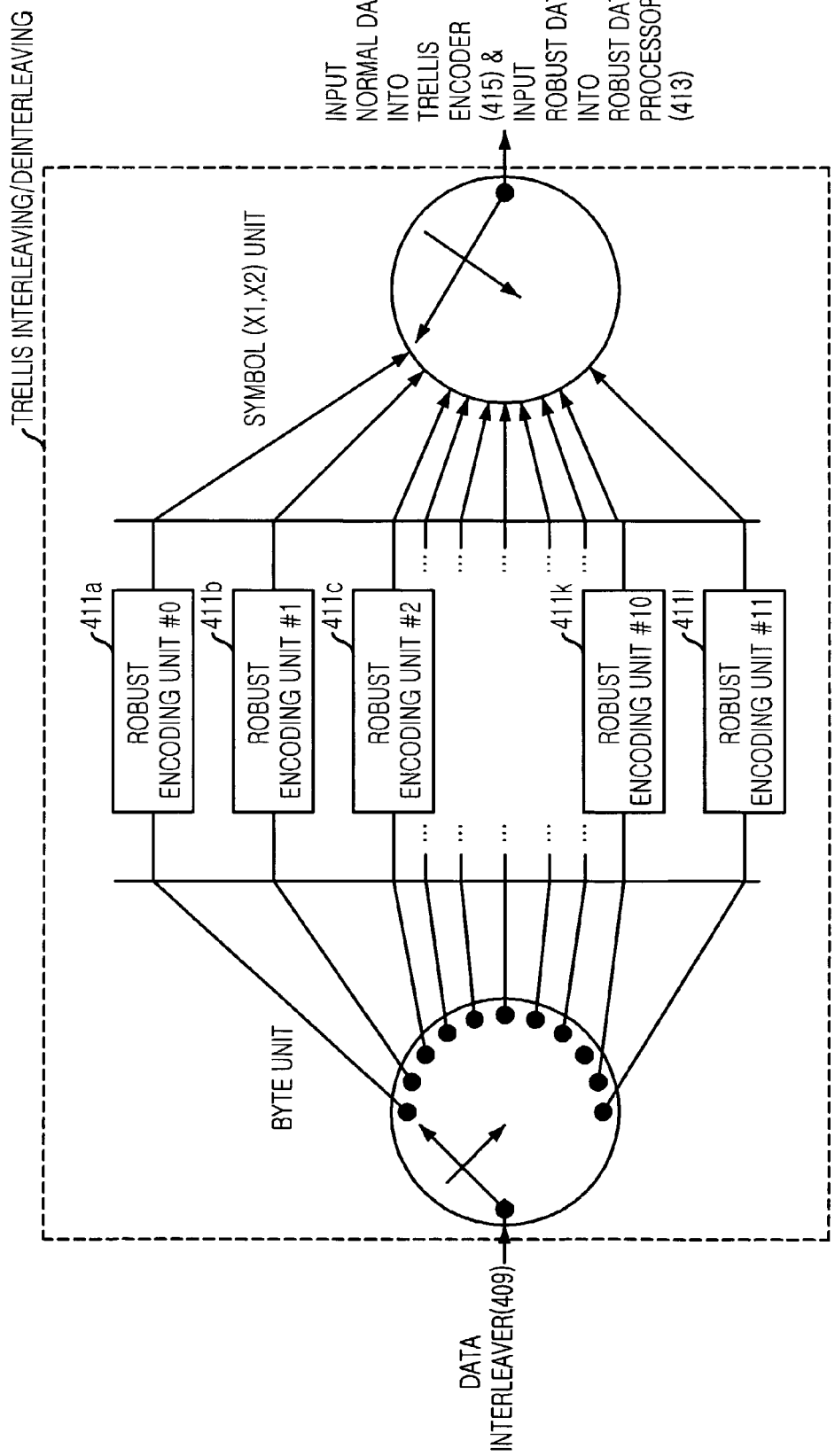
FIG. 7 is a diagram illustrating a robust encoder of FIG. 4.

FIG. 7 is a diagram illustrating a robust encoder of FIG. 4 in detail. As shown, the robust encoder 411 specifically includes a plurality of identical robust encoding units 411*a* to 411*l* in parallel. The robust encoder 411 performs trellis interleaving on the interleaved normal/robust data and the interleaved robust data flag and performs coding on the trellis-interleaved normal/robust data based on the trellis-interleaved robust data flag. The normal/robust data outputted from the data interleaver 409 are inputted into the 12 robust encoding units 411*a* to 411*l* sequentially on a byte basis, and two-bit normal/robust data expressed as X1' and X2' are coded into two-bit normal/robust data symbols expressed as X1 and X2. For example, an input bit X2' is a code word of MSB(7,5,3,1) and an input bit X1' is a code word of LSB(6, 4,2,0). As described above, although the MSB(7,5,3,1) and the LSB(6,4,2,0) of normal data all include information data, the LSB(6,4,2,0) of robust data includes information data and the MSB(7,5,3,1) of robust data includes arbitrary values.

The normal data symbols among data symbols coded in the robust encoding unit 411 is inputted to the trellis encoder 415 by bypassing the robust data processor 413, and robust data symbols are inputted to the trellis encoder 415 through the robust data processor 413. In this process, the data symbols coded in the 12 robust encoding units 411*a* to 411*l* are inputted into the trellis encoder 415 or the robust data processor 413 sequentially to thereby performing the trellis interleaving entirely.

Referring to FIG. 4, the trellis encoder 415 is the same as the trellis encoder defined in the current ATSC A/53 Standards. Although not illustrated in the drawing, the trellis encoder 415, too, is formed of a plurality of identical trellis encoding units, for example, 12 identical trellis encoding units connected in parallel, just as the robust encoder 411. The normal data symbols X1 and X2 inputted into the trellis encoder 415 after bypassing the robust data processor 413 or the robust data symbols X1 and X2 inputted into the trellis encoder 415 through the robust data processor 413 are inputted into the 12 trellis encoding units, and the trellis encoder 415 performs trellis encoding on the inputted symbols X1 and X2 into 8-level symbols. The 8-level symbols obtained by being encoded in the 12 trellis encoding units are inputted into the second multiplexer 417 sequentially. This way, the trellis encoding is carried out entirely.

Figure 8:
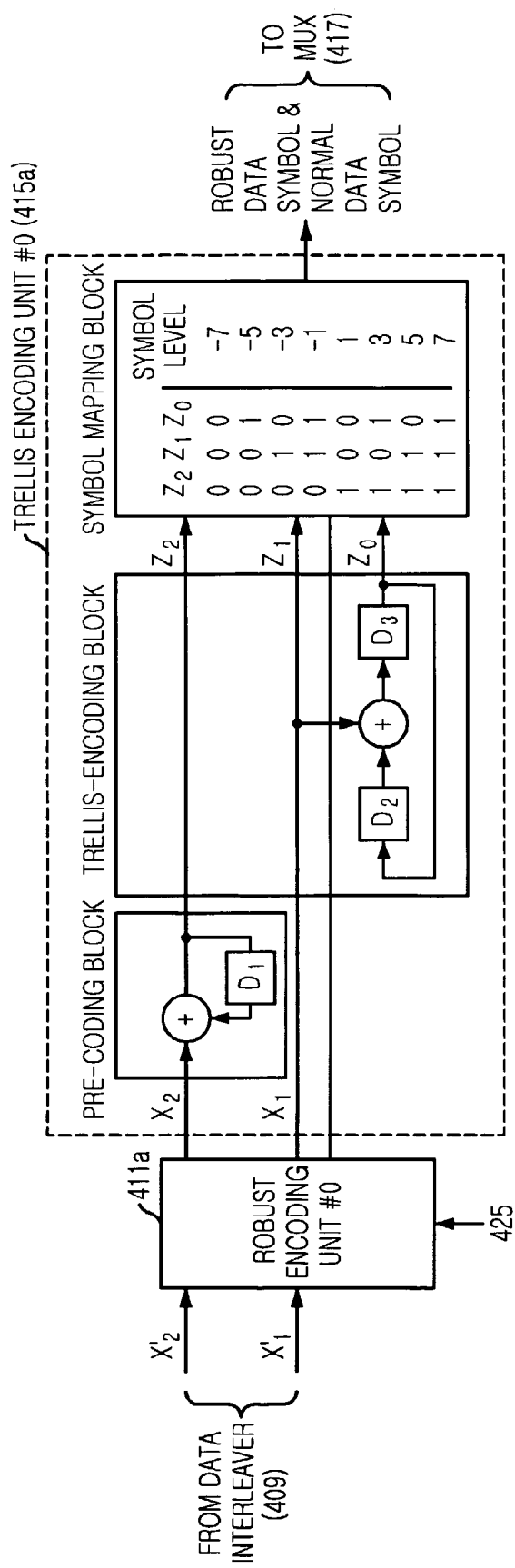
FIG. 8 is a diagram describing a robust encoder and a trellis encoder of FIG. 4.

FIG. 8 is a diagram describing a robust encoder and a trellis encoder of FIG. 4. Since the robust data processor 413 to be described later processes only robust data, FIG. 8 exemplifies conceptual connection between a robust encoding unit #0 411*a* and a trellis encoding unit #0 415*a*.

As defined in the current ATSC A/53 Standards, the trellis encoder 415 includes a pre-coding block, a trellis encoding block, and a symbol mapping block. The pre-coding block and the trellis encoding block includes registers D1, D2 and D3 for storing symbol delay values, for example, 12 symbol delay values.

The robust encoding unit #0 411*a* codes two-bit normal/robust data X1' and X2' inputted from the data interleaver 409 into two-bit normal/robust data symbols X1 and X2, and the trellis encoding unit #0 415*a* outputs 8-level signals to the second multiplexer 417 based on symbols Z0, Z1 and Z2 obtained by performing trellis encoding on the two-bit normal/robust data symbols X1 and X2.

A method for coding robust data by using the robust encoder 411 and the trellis encoder 415 is already suggested by the Phillips Company and the Electronics and Telecommunications Research Institute (ETRI).

Figure 9:
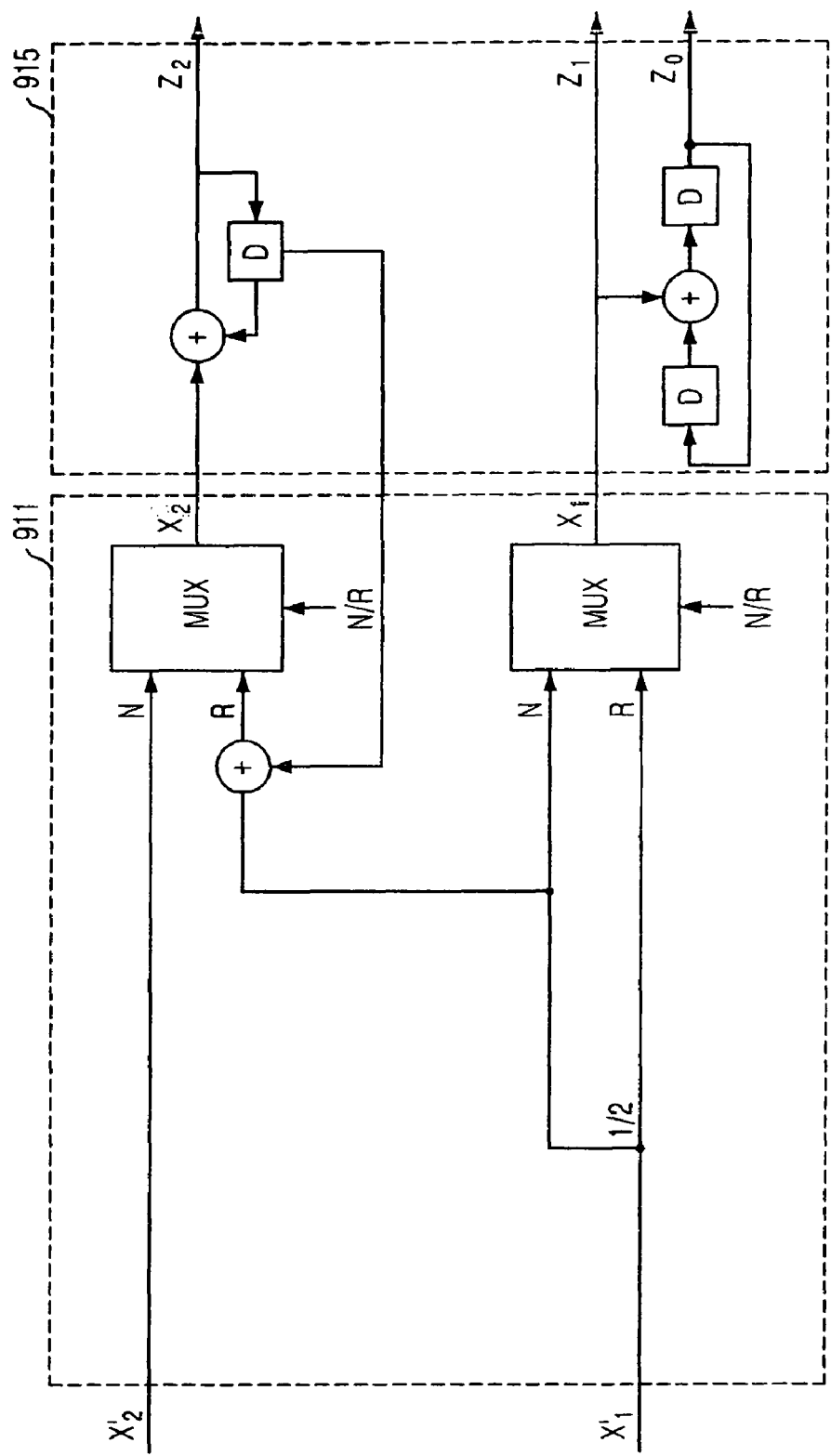
FIG. 9 is a block diagram describing robust data trellis coding in a P-2VSB method which is suggested by a Philips Company.

FIG. 9 is a block diagram describing P-2VSB coding of robust data which is suggested by the Philips Company.

As described above, a robust encoder 911 outputs the trellis-encoded symbols Z0, Z1 and Z2 in four levels by equalizing the coded values Z2 and Z1 of a trellis encoder 915 obtained through a precoder remover based on the value X1' between the inputted signals X1' and X2'.

The robust data P-2VS coding method suggested by the Philips Company has a problem that the average power of symbols representing robust data is increased compared to the conventional 8-VSB method because the output symbols of the trellis encoder 915 use four levels {−7,−5,5,7} or {−7,−3,3,7}.

Figure 10:
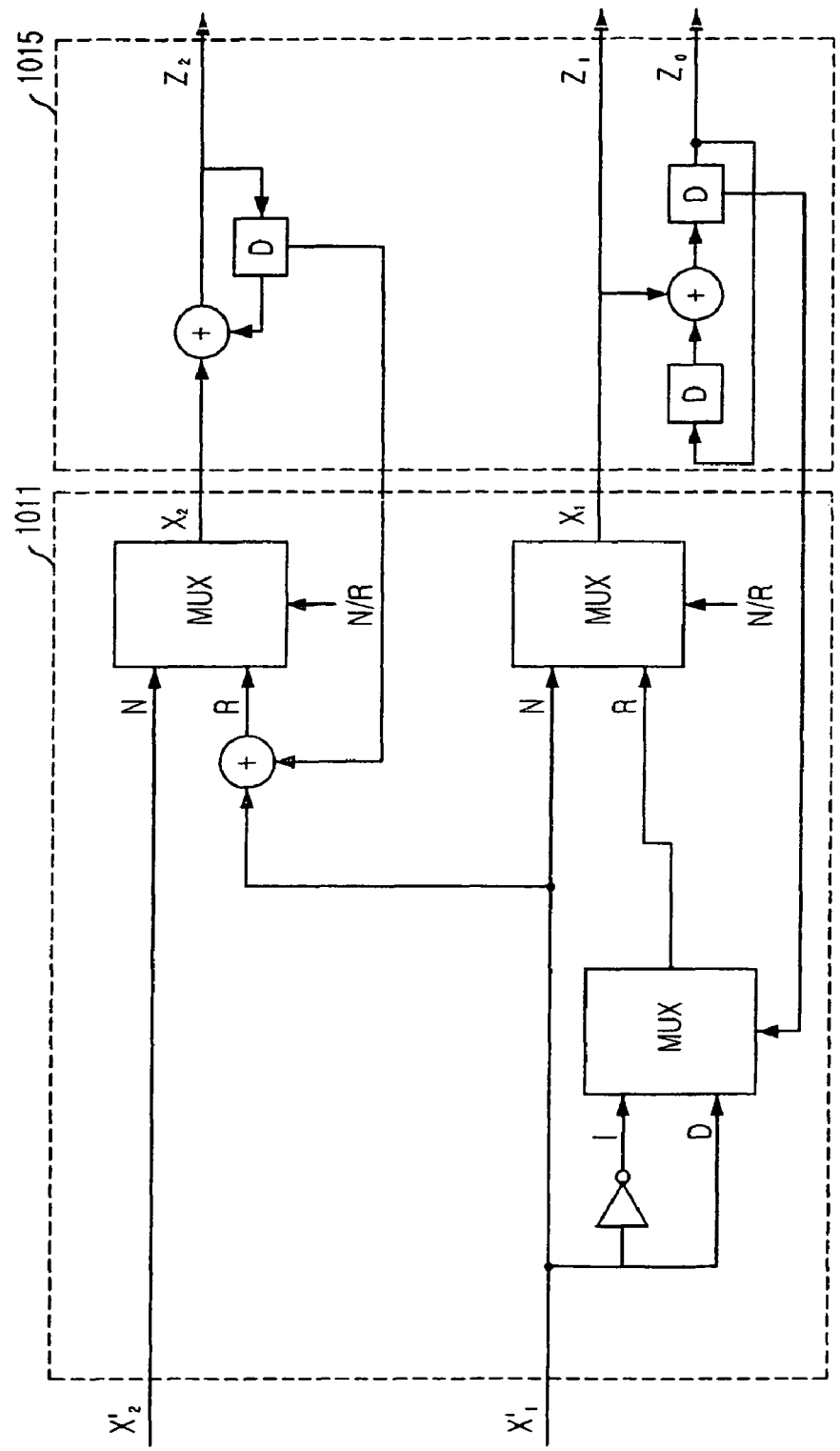
FIGS. 10 and 11 are block diagrams showing robust data trellis coding in an E-4VSB method which is suggested by the Electronics and Telecommunications Research Institute (ETRI)
Figure 11:
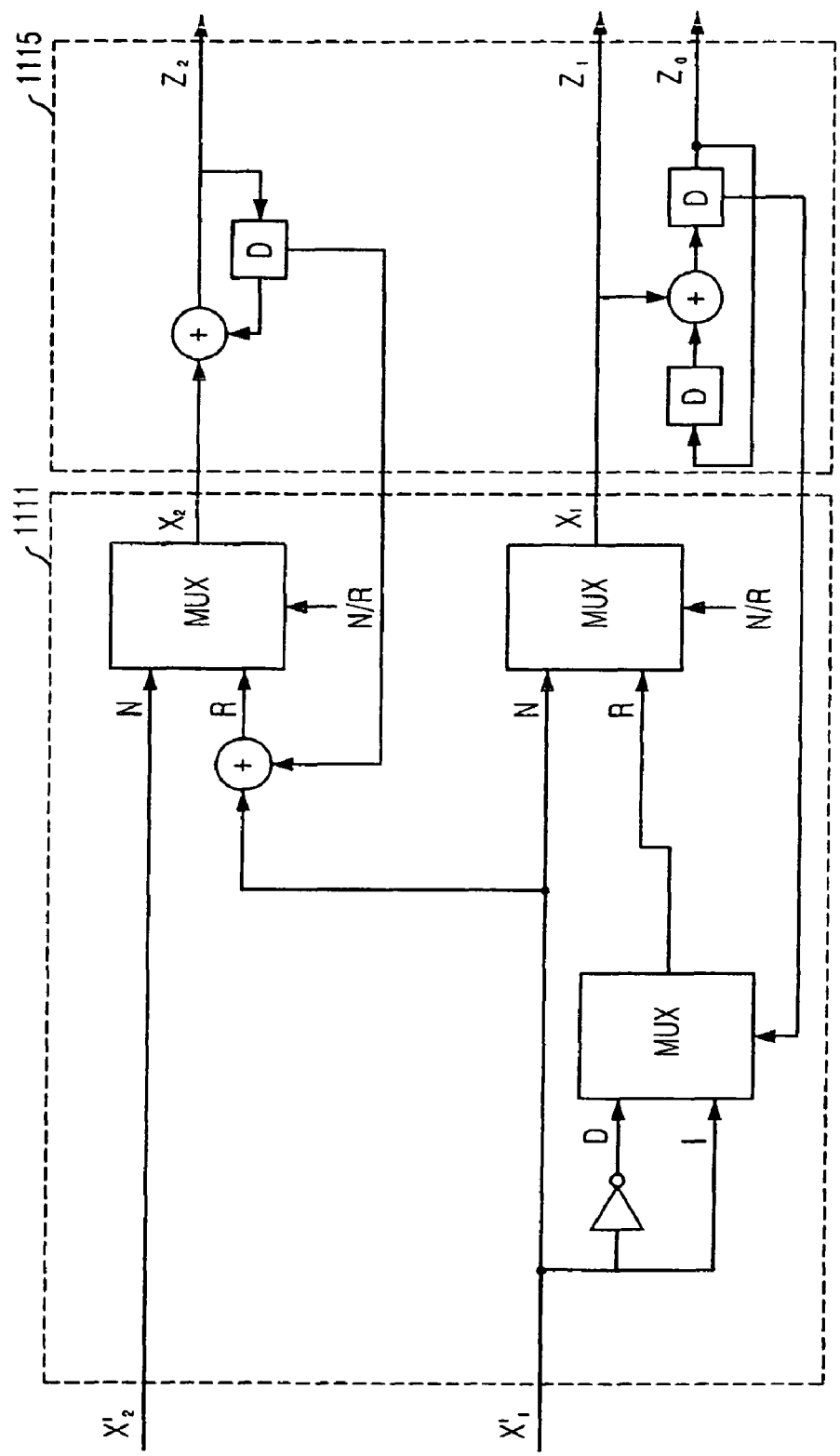

FIGS. 10 and 11 are block diagrams showing robust data trellis coding in E-4VSB method which is suggested by the ETRI. A robust encoder 1011 of FIG. 10 estimates a coded value Z0 of a trellis encoder 1015 and makes the coded values Z2 and Z1 of the trellis encoder 1015 have the same value based on the value of an input signal X1', when the value Z0 is 0.

Also, the robust encoder 1011 codes robust data in such a manner that the coded values Z2 and Z1 of the standard trellis encoder have values inverse to each other, when the coded value Z0 of the trellis encoder 1015 is 1 and, thus, the level of symbols outputted from the trellis encoder 1015 is {−7,−1,3, 5}.

A robust encoder 1111 of FIG. 11 estimates a coded value Z0 of a trellis encoder 1115 and makes the coded values Z2 and Z1 of the trellis encoder 1115 have values inverse to each other based on the value of an input signal X1', when the value Z0 is 0.

Also, the robust encoder 1111 codes robust data in such a manner that the coded values Z2 and Z1 of the standard trellis encoder have the same value, when the coded value Z0 of the trellis encoder 1115 is 1 and, thus, the level of symbols outputted from the trellis encoder 1115 is {−5,−3,1,7}.

The E-4VSB coding method suggested by the ETRI can have performance less improved than the normal data 8-VSB method in the AWGN channel environment, since the free distance of the trellis encoder that determines the performance of robust data is not that large.

Figure 12:
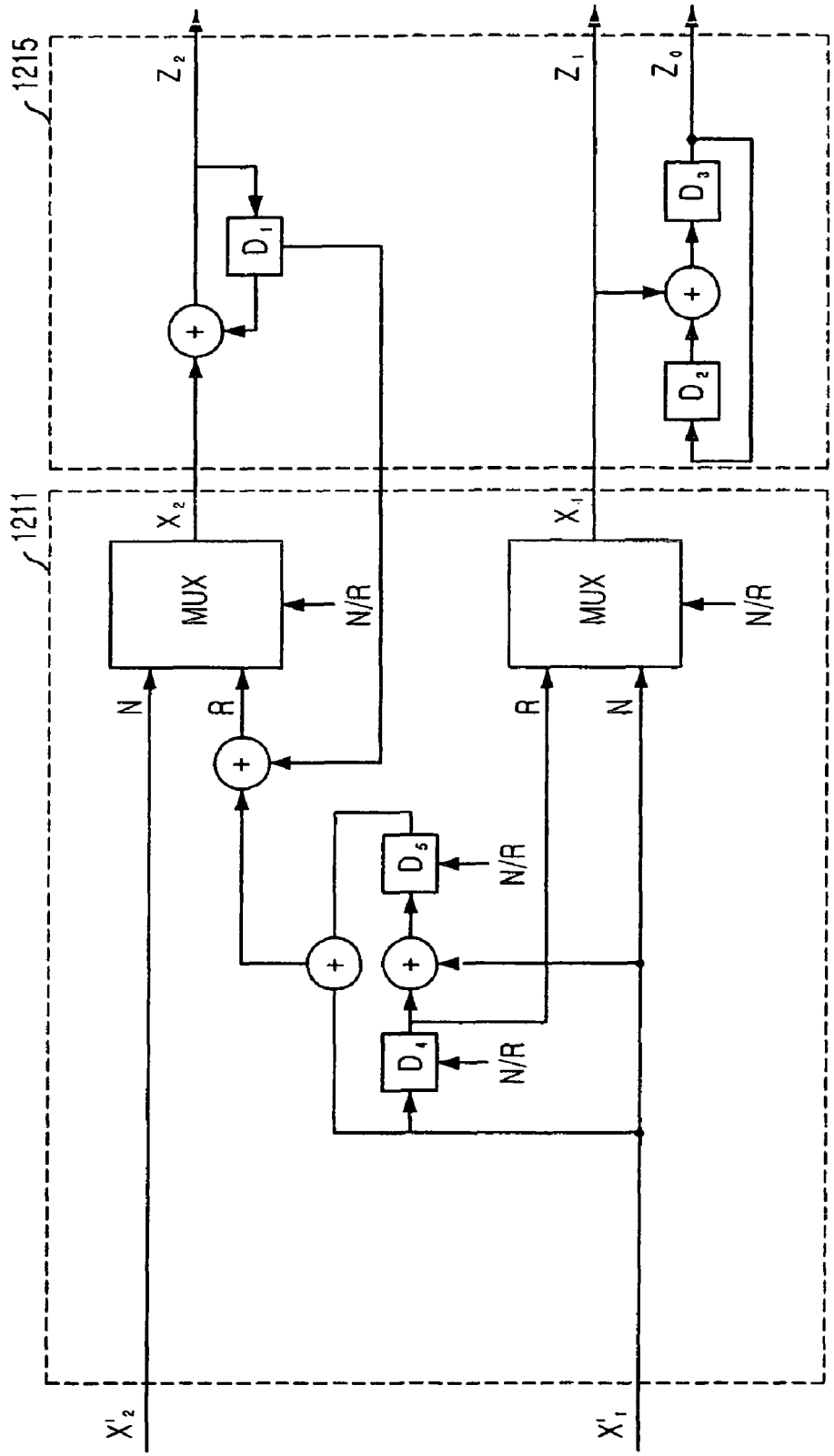
FIGS. 12 and 13 are block diagrams illustrating robust data trellis coding in an E-8VSB method which is suggested by the ETRI.
Figure 13:
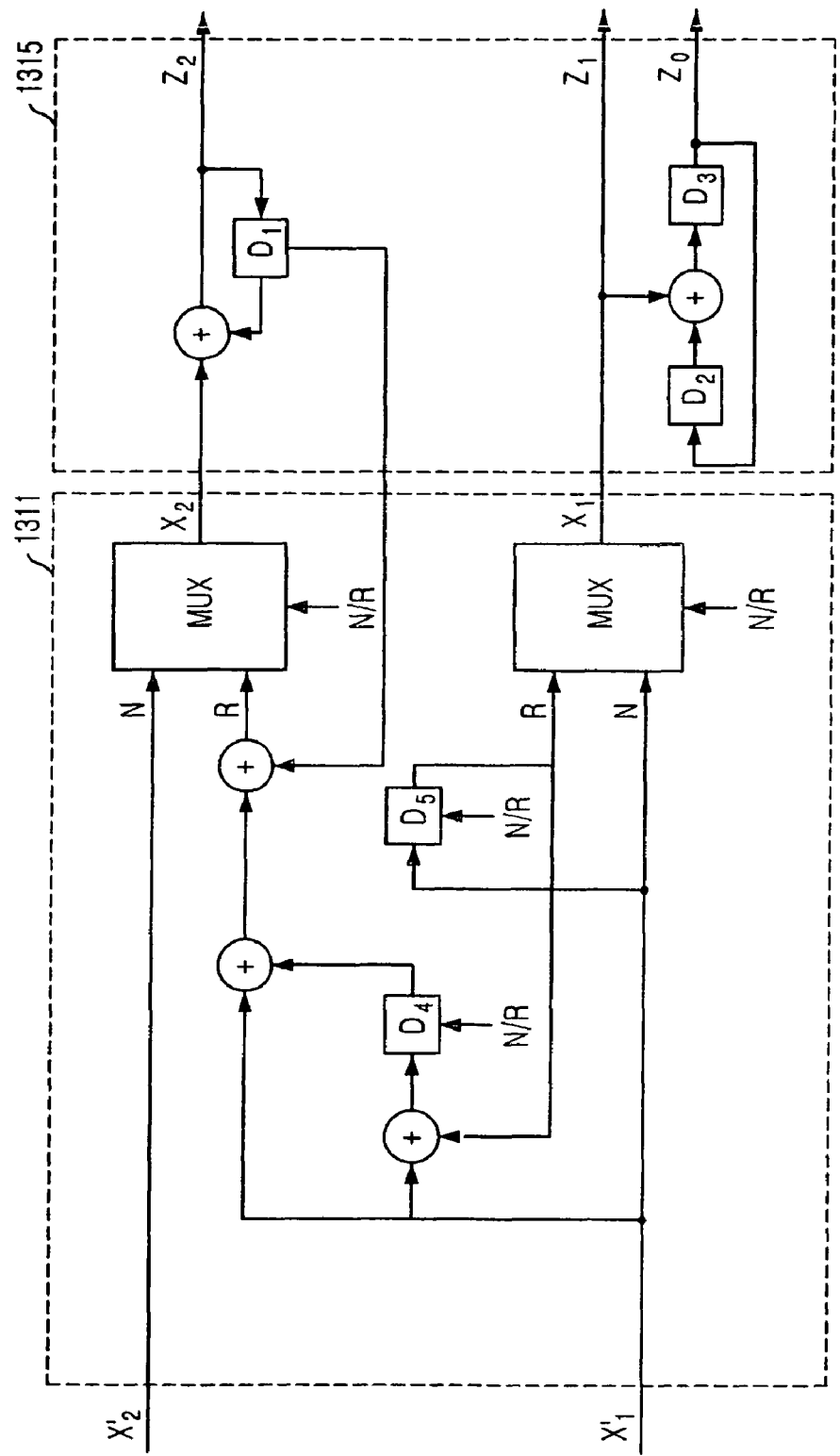

FIGS. 12 and 13 are block diagrams illustrating robust data E-8VSB coding which is suggested by the ETRI.

As shown in FIG. 12, an input signal X1' is coded by adding registers D4 and D5 for generating robust data to a robust encoder 1211.

The output signal of a trellis encoder 1215 based on the input signal X1' and the subsequent state are as shown in Tables 3 and 4.

TABLE 3

| CURRENT STATE | INPUT | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | −7 | −5 | −7 | −5 | 1 | 3 | 1 | 3 | −3 | −1 | −3 | −1 | 5 | 7 | 5 | 7 |
| 1 | 1 | 3 | 1 | 3 | −7 | −5 | −7 | −5 | 5 | 7 | 5 | 7 | −3 | −1 | −3 | −1 |

TABLE 4

| CURRENT STATE | INPUT | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | 0 | 2 | 1 | 3 | 0 | 2 | 1 | 3 | 5 | 7 | 4 | 6 | 5 | 7 | 4 | 6 |
| 1 | 12 | 14 | 13 | 15 | 12 | 14 | 13 | 15 | 9 | 11 | 8 | 10 | 9 | 11 | 8 | 10 |

The 16 states of Table 3 are calculated based on an equation 4.

$$S = D_4 \times 8 + D_5 \times 4 + D_2 \times 2 + D_3 \qquad \text{Eq. 4}$$

Meanwhile, the state values of the registers D4 and D5 additionally used to generate robust data are not changed when normal data are inputted, and the output signals based on input and the subsequent state are as shown in Tables 5 and 6.

TABLE 5

| CURRENT STATE | INPUT | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | 7,1 | -5,3 | -7,1 | -5,3 | 7,1 | -5,3 | -7,1 | -5,3 | 7,1 | -5,3 | -7,1 | -5,3 | 7,1 | -5,3 | -7,1 | -5,3 |
| 1 | 3,5 | 1,7 | -3,5 | 1,7 | 3,5 | 1,7 | -3,5 | 1,7 | 3,5 | 1,7 | -3,5 | 1,7 | 3,5 | 1,7 | -3,5 | 1,7 |

TABLE 6

| CURRENT STATE | INPUT | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | 0 | 2 | 1 | 3 | 4 | 6 | 5 | 7 | 8 | 10 | 9 | 11 | 12 | 14 | 13 | 15 |
| 1 | 1 | 3 | 0 | 2 | 5 | 7 | 4 | 6 | 9 | 11 | 8 | 10 | 13 | 15 | 12 | 14 |

As shown in FIG. 13, an input signal X1' is coded by adding registers D4 and D5 for generating robust data to a robust encoder 1311.

The output signal of a trellis encoder 1315 based on the input signal X1' and the subsequent state are as shown in Tables 7 and 8.

TABLE 7

| CURRENT STATE | INPUT | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | -7 | -5 | -7 | -5 | -3 | -1 | -3 | -1 | 1 | 3 | 1 | 3 | 5 | 7 | 5 | 7 |
| 1 | 1 | 3 | 1 | 3 | 5 | 7 | 5 | 7 | -7 | -5 | -7 | -5 | -3 | -1 | -3 | -1 |

TABLE 8

| CURRENT STATE | INPUT | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | 0 | 2 | 1 | 3 | 9 | 11 | 8 | 10 | 0 | 2 | 1 | 3 | 9 | 11 | 8 | 10 |
| 1 | 12 | 14 | 13 | 15 | 5 | 7 | 4 | 6 | 12 | 14 | 13 | 15 | 5 | 7 | 4 | 6 |

The 16 states of Table 7 are calculated based on the equation 4.

Meanwhile, the state value of the registers D4 and D5 additionally used to generate the robust data are not changed, when normal data are inputted, and the output signal based on the input and the subsequent state are as shown in the Tables 5 and 6.

Since the E-8VSB coding method suggested by the ETRI uses 8 levels which is the same as the general 8-VSB method, it can show inferior performance in the multi-path channel, compared to the P-2VSB method.

Therefore, the reception performance can be improved remarkably by properly mixing the P-2VSB, E-4VSB, and E-8VSB.

Mixture of P-2VSB and E-8VSB

In accordance with the present embodiment where robust data are generated by mixing the P-2VSB and E-8VSB methods, reception performance can be improved according to the mixing rate.

It is preferable that the rate of robust data transmitted in the P-2VSB method is maintained to be equal to or less than 33% of the entire data to limit the influence of the increase in the average power of the P-2VSB and thereby show the optimal performance.

Table 9 presents a robust data packet adding method that can show the optimal performance by maintaining the distance of the robust data packet coded in the P-2VSB method to be not less than 3. Herein, 16-state 8-level trellis coding methods of structures including the E-8VSB which is suggested by Zenith/ATI, other than the E-8VSB method suggested by the ETRI can be applied in the same way.

TABLE 9

| Packet No. | Kind of Packet |
|---|---|
| 0 | robust (P2) |
| 1 | robust (E8) |
| 2 | Robust (E8) |
| 3 | Robust (P2) |
| 4 | Robust (E8) |
| 5 | Robust (E8) |
| 6 | Robust (P2) |
| 7 | Robust (E8) |
| 8 | Robust (E8) |
| 9 | Robust (P2) |
| 10 | Robust (E8) |
| 11 | Robust (E8) |
| 12 | Robust (P2) |
| 13 | Robust (E8) |
| 14 | Robust (E8) |
| 15 | Robust (P2) |
| 16 | Robust (E8) |
| ... | ... |

Mixture of P-2VSB and E-4VSB

In accordance with the present embodiment where robust data are generated by mixing the P-2VSB and E-4VSB methods, reception performance can be improved according to the mixing rate.

In the present embodiment, the reception performance can be improved by limiting the rate of robust data transmitted in the P-2VSB method to be equal to or less than 33% of the entire data in order not to degrade performance, a problem which is caused by an increase in the average power of the P-2VSB method.

Table 10 presents a robust data packet adding method that can show the optimal performance by maintaining the distance of the robust data packet transmitted in the P-2VSB method to be not less than 3.

TABLE 10

| Packet No. | Kind of Packet |
|---|---|
| 0 | Robust (P2) |
| 1 | Robust (E4) |
| 2 | Robust (E4) |
| 3 | Robust (P2) |
| 4 | Robust (E4) |
| 5 | Robust (E4) |
| 6 | Robust (P2) |
| 7 | Robust (E4) |
| 8 | Robust (E4) |
| 9 | Robust (P2) |
| 10 | Robust (E4) |
| 11 | Robust (E4) |
| 12 | Robust (P2) |
| 13 | Robust (E4) |
| 14 | Robust (E4) |
| 15 | Robust (P2) |
| 16 | Robust (E4) |
| ... | ... |

When it is assumed that the mixing rate of the robust data and normal data is 50:50 in a double stream structure, the 50% robust data have been transmitted in either the E-8VSB method or the P-2VSB method conventionally.

In the present embodiment, it is established that the quantity of the robust data transmitted in the E-4VSB method is 35% and the quantity of the robust data transmitted in the P-2VSB method is 15%. When the robust data are 50%, a data field includes 162 robust data packets. Therefore, the number of robust data packets of the E-4VSB method is 108, while the number of robust data packets of the P-2VSB method is 54.

The positions of the robust data packets are as shown in Table 11 in accordance with the present embodiment.

TABLE 11

| Packet No. | Kind of Packet |
|---|---|
| 0 | Robust (P2) |
| 1 | Robust (E8) |
| 2 | Robust (E8) |
| 3 | Robust (P2) |
| 4 | Robust (E8) |
| 5 | Robust (E8) |
| 6 | Robust (P2) |
| 7 | Robust (E8) |
| 8 | Robust (E8) |
| 9 | Robust (P2) |
| 10 | Robust (E8) |
| 11 | Robust (E8) |
| 12 | Robust (P2) |
| 13 | Robust (E8) |
| 14 | Robust (E8) |
| 15 | Robust (P2) |
| 16 | Robust (E8) |
| 17 | robust (E8) |
| 18 | Robust (P2) |
| 19 | Robust (E8) |
| 20 | Robust (E8) |
| 21 | Robust (P2) |
| 22 | Robust (E8) |
| 23 | Robust (E8) |
| 24 | Robust (P2) |
| 25 | Robust (E8) |
| 26 | Robust (E8) |
| 27 | Robust (P2) |
| 28 | Robust (E8) |
| 29 | Robust (E8) |
| 30 | Robust (P2) |
| 31 | Robust (E8) |
| 32 | Robust (E8) |
| 33 | Robust (P2) |
| 34 | Robust (E8) |

TABLE 11-continued

| Packet No. | Kind of Packet |
|---|---|
| 35 | Robust (E8) |
| ... | ... |
| 162 | Normal |
| 163 | Normal |
| 164 | Normal |
| ... | ... |
| 281 | Normal |
| 282 | Normal |
| 283 | Normal |
| 284 | Normal |
| 285 | Normal |
| 286 | Normal |
| ... | ... |
| 306 | Normal |
| 307 | Normal |
| 308 | Normal |
| 309 | Normal |
| 310 | Normal |
| 311 | Normal |

Mixture of P-2VSB, E-4VSB and E-8VSB

As described above, it is possible to mix all the E-4VSB, E-8VSB and P-2VSB methods to generate robust data. As aforementioned, broadcasting stations can select and transmit an appropriate method according to a specific usage and requested robustness.

Figure 14:
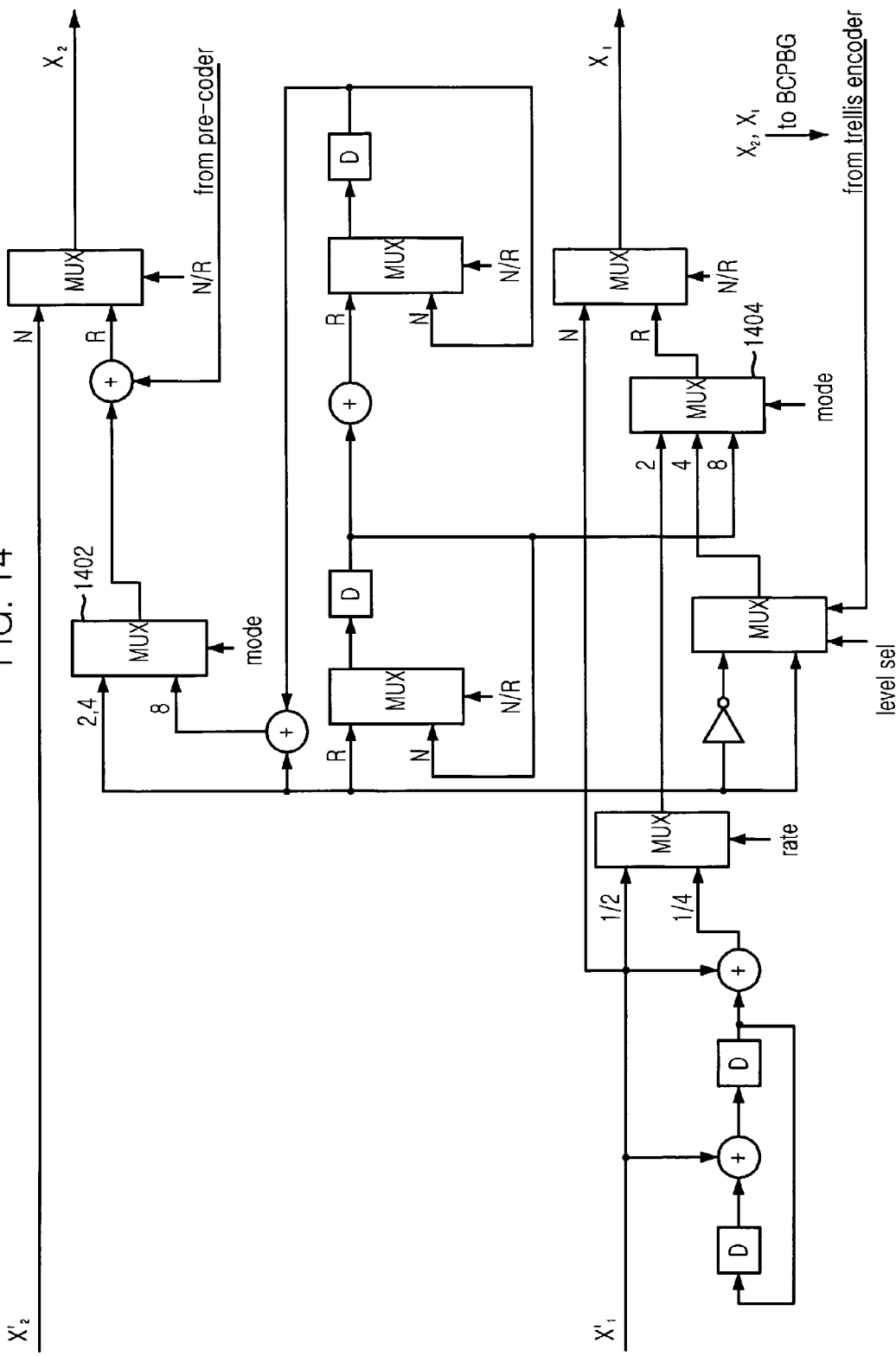
FIG. 14 is a block diagram describing trellis coding for mixing robust data in P-2VSB, E-4VSB, and/or E-8VSB methods in accordance with an embodiment of the present invention.

FIG. 14 is a block diagram describing robust encoder for mixing robust data in P-2VSB, E-4VSB, and/or E-8VSB in accordance with an embodiment of the present invention.

As shown, the robust encoder of FIGS. 9 to 13 is multiplexed. That is, the multiplexers 1402 and 1404 output robust data coded in the P-2VSB, E-4VSB, and/or E-8VSB method according to a requested mode.

The mode can be controlled by using four bits, as shown in Table 12.

TABLE 12

| Mode | Description |
|---|---|
| 0000 | General E-8VSB |
| 0001 | E-8VSB |
| 0010 | E-4VSB |
| 0011 | P-2VSB |
| 0100 | P-2VSB + E-8VSB |
| 0101 | P-2VSB + E-4VSB |
| 0110 | E-4VSB + E-8VSB |
| 0111 | P-2VSB + E-4VSB + E-8VSB |

Figure 15:
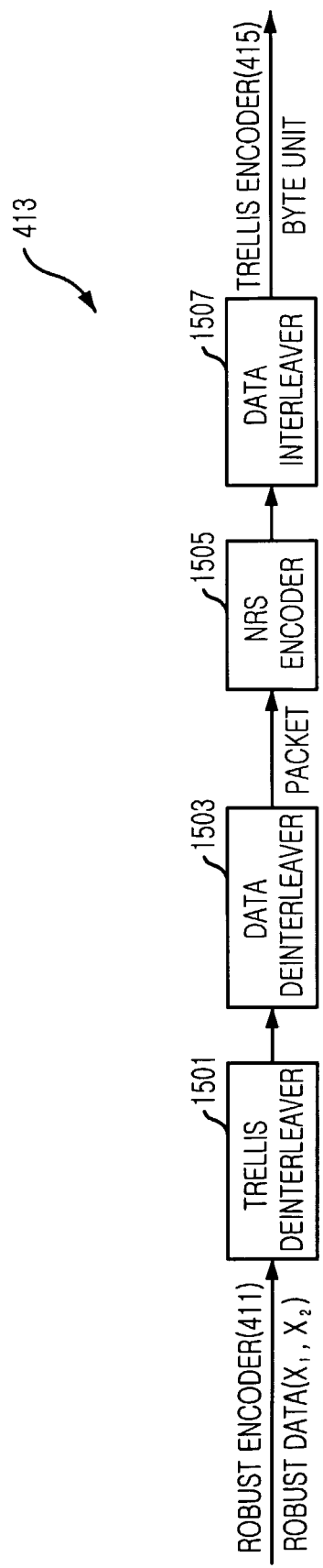
FIG. 15 is a block diagram describing a robust data processor of FIG. 4.

FIG. 15 is a block diagram describing a robust data processor of FIG. 4. As illustrated, the robust data processor 413 includes a trellis deinterleaver 1501, a data deinterleaver 1503, an RS encoder 1505, and a data interleaver 1507. The robust data X1 and X2 and a robust data flag which are outputted from the robust encoder 411 go through trellis deinterleaving and data deinterleaving in the trellis deinterleaver 1501 and the data deinterleaver 1503 and reassembled in the form of a packet.

As described above, 20-byte arbitrary information is added to the 207-byte data block generated in the packet formatter 503, and the RS encoder 1505 replaces the 20-byte arbitrary information with RS parity information. The robust data packet with the RS parity information therein is interleaved in the data interleaver 1507 and outputted to the trellis encoder 415 on a byte basis.

Referring to FIG. 4 again, in the second multiplexer 417, normal data and robust data are combined with a segment synchronization bit sequence and a field synchronization bit sequence, which are transmitted from a synchronization unit (not shown), to thereby generate a transmission data frame. Subsequently, a pilot signal is added in the pilot adder. A symbol stream is modulated into VSB-suppressed carrier in a VSB modulator. An 8-VSB symbol stream of a baseband is converted into a radio frequency signal in an RF converter after all and transmitted.

Figure 16:
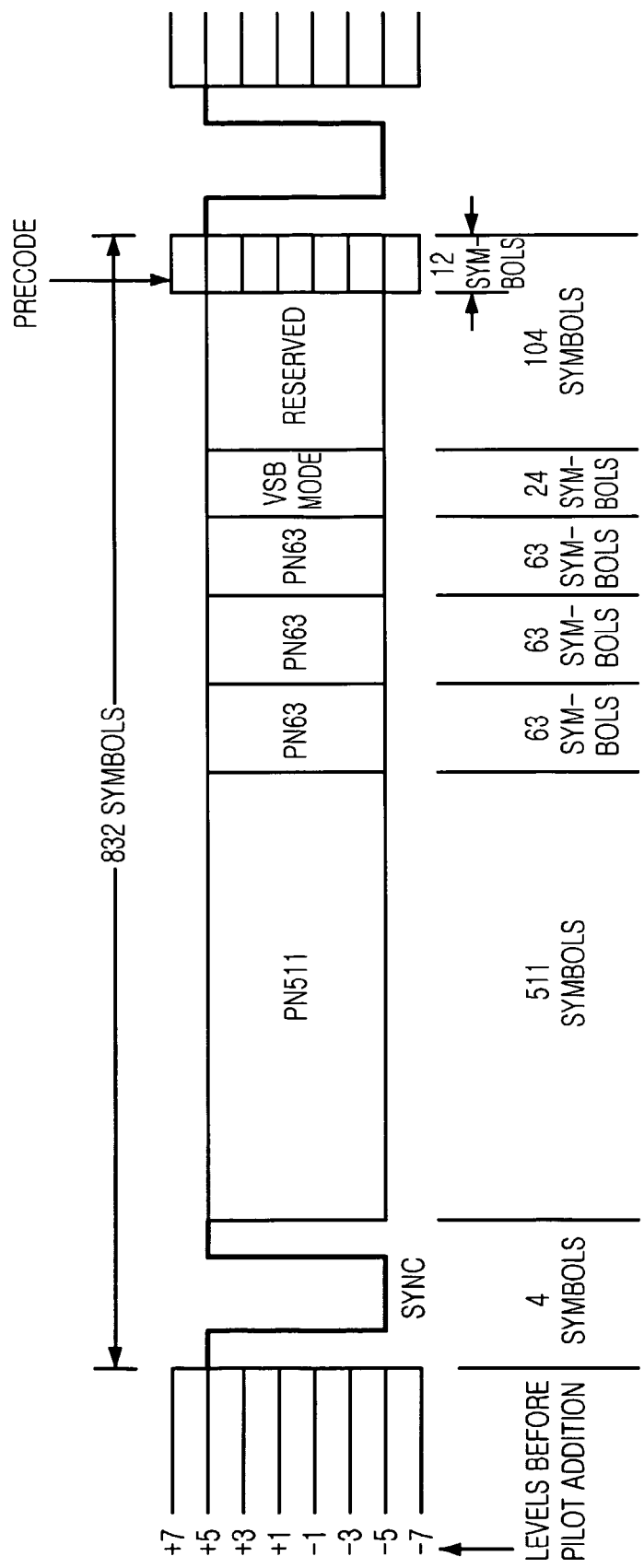
FIG. 16 is a diagram showing a field synchronous segment of a data frame transmitted by the transmitter of FIG. 4.

FIG. 16 is a diagram showing a field synchronous segment of a data frame transmitted by the transmitter of FIG. 4. As shown in the drawing, a segment transmitted from the transmitter 400 is basically the same as the segment of the ATSC A/53 Standards. If any, in a reserved area corresponding to the last 104 symbols of a segment, 92 symbols except precode 12 symbols contains information for restoring the robust data packet. The information for restoring the robust data packet includes an NRP (refer to equation 1), which is a ratio of robust data to normal data in a field, a coding rate of the robust data, e.g., 1/2 or 1/4, and a robust data coding method. As to be described later, a receiver suggested in the embodiment of the present invention generates a robust data flag out of the information for restoring the robust data packet, and constitutional elements of the receiver can check out whether currently processed data are robust data or not by using the robust data flag.

Figure 17:
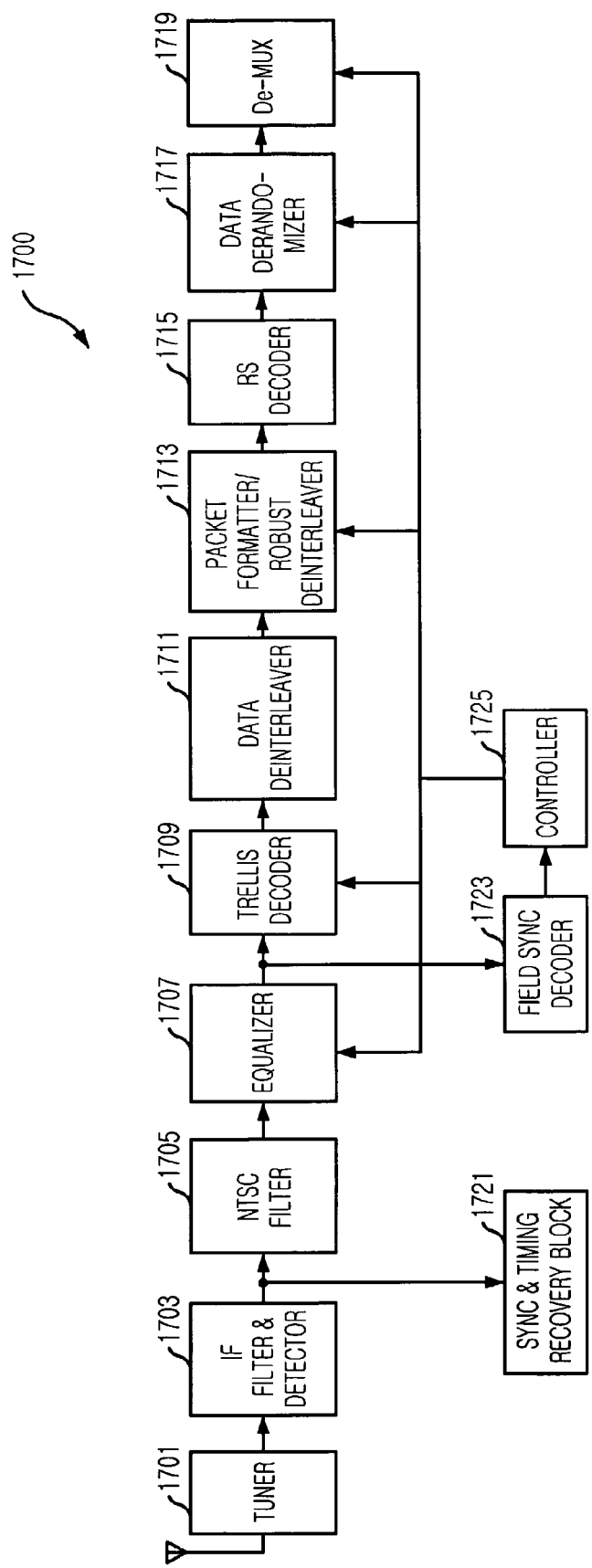
FIG. 17 is a block diagram illustrating a DTV receiver in accordance with an embodiment of the present invention.

FIG. 17 is a block diagram illustrating a DTV receiver in accordance with an embodiment of the present invention. As shown, a receiver 1700 includes a tuner 1701, an IF filter and detector 1703, an NTSC filter 1705, an equalizer 1707, a trellis decoder 1709, a data deinterleaver 1711, a packet formatter/robust deinterleaver 1713, an RS decoder 1715, a data derandomizer 1717, a demultiplexer 1719, a synch and timing recovery block 1721, a field synch decoder 1723, and a controller 1725.

The tuner 1701, the IF filter and detector 1703, the NTSC filter 1705, the data deinterleaver 1711, the RS decoder 1715, the synch and timing recovery block 1721 perform the same functions as the tuner 201, the IF filter and detector 203, the NTSC filter 205, the data deinterleaver 211, the RS decoder 213, and the synch and timing recovery block 215.

The field synch decoder 1723 receives a segment of a data frame illustrated in FIG. 16, restores the robust data packet restoring information in the reserved area, which includes information on the ratio of robust data to normal data in a field, information on the coding rate of the robust data, and information on a robust data coding method, and transmits it to the controller 1725.

Figure 18:
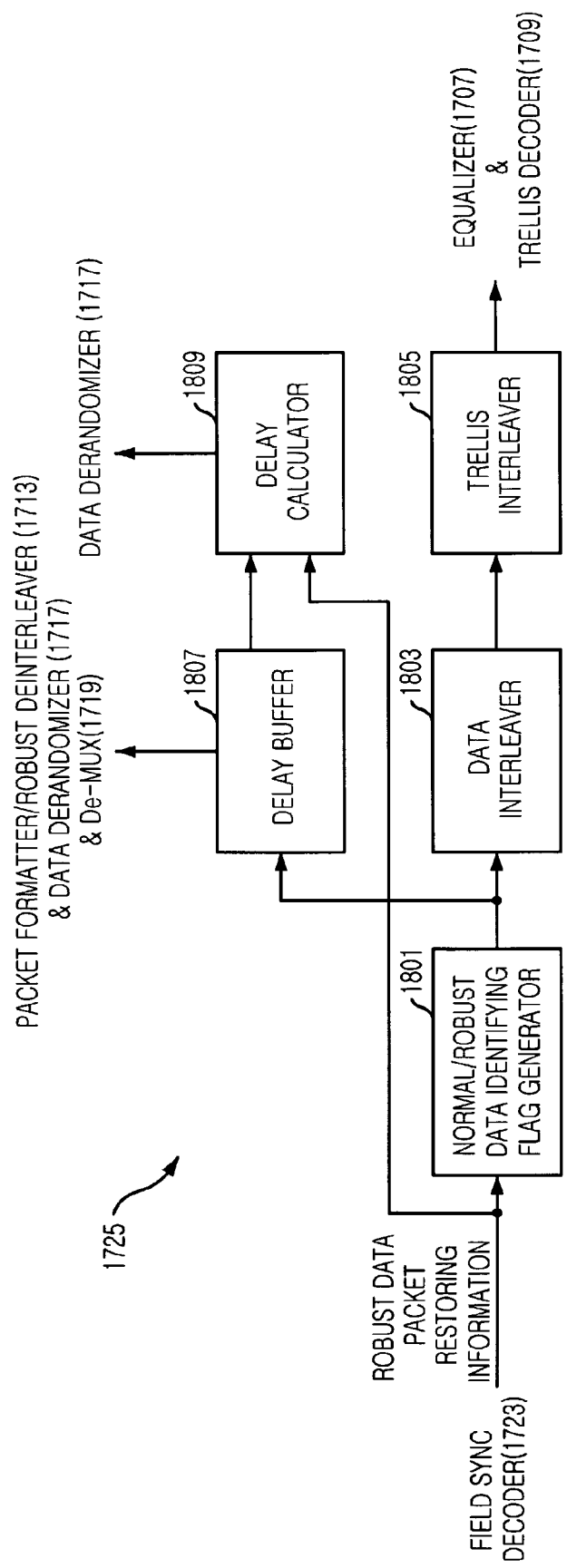
FIG. 18 is a block diagram showing a controller of FIG. 17.

FIG. 18 is a block diagram showing a controller of FIG. 17. As shown, the controller 1725 includes a normal/robust data identifying flag generator 1801, a data interleaver 1803, a trellis interleaver 1805, a delay buffer 1807, and a delay calculator 1809.

The normal/robust data identifying flag generator 1801 generates a robust data flag by using the robust data packet restoring information transmitted from the field synch decoder 1723.

The generated robust data flag goes through a bit-unit data interleaving and trellis interleaving based on the ATSC A/53 in the data interleaver 1803 and the trellis interleaver 1805 and the interleaved robust data flag is transmitted to the equalizer 1707 and the trellis decoder 1709. The robust data flag included in the data frame transmitted from the transmitter 400 is already interleaved through the data interleaving and the trellis interleaving, the equalizer 1707 and the trellis decoder 1709 performs equalization and trellis decoding based on the interleaved robust data flag obtained from the data interleaving and the trellis interleaving.

Meanwhile, the delay buffer 1807 receives the robust data flag generated in the normal/robust data identifying flag generator 1801 and transmits the robust data flag to the packet formatter/robust deinterleaver 1713 in consideration of delay generated while data are processed in the trellis decoder 1709 and the data deinterleaver 1711. Also, the delay buffer 1807 transmits the robust data flag to the data derandomizer 1717, the demultiplexer 1719, and the delay calculator 1809, individually, in consideration of delay generated while data are processed in the packet formatter/robust deinterleaver 1713.

The delay calculator 1809 calculates delay time of a robust data packet by using the robust data flag, which is obtained in consideration of delay with respect to normal data generated while robust data are processed in the packet formatter/robust deinterleaver 1713 and transmitted from the delay buffer 1807, and the robust data packet restoring information, which is transmitted from the field synch decoder 1723, and transmits the calculated delay time to the data derandomizer 1717. The data derandomizer 1717 is synchronized with a field synchronous signal of a data frame and performs derandomization. The robust data packet restoring information transmitted from the field synch decoder 1723 includes information on the position of the robust data packet in the data frame. However, the packet formatter/robust deinterleaver 1713 can process only a robust data packet and, particularly, the deinterleaving process carried out in the robust deinterleaver delays the robust data packet by a few packets. The delay calculator 1809 calculates delay time with respect to the robust data packet based on the received robust data packet restoring information and the robust data flag to compensate for the delay with respect to the robust data packet and transmits the delay time to the data derandomizer 1717. The data derandomizer 1717 derandomizes a normal data packet and a robust data packet based on the received robust data flag and the delay time with respect to the robust data packet. For example, when the $n^{th}$ normal data packet is derandomized, the next robust data packet to be derandomized is not the $(n+1)^{th}$ robust data packet but it can be the $k^{th}$ robust data packet (k<n). The delay of the robust data packet is longer than that of the normal data packet, because the delay caused by restoring the original packet in the packet formatter/robust deinterleaver 1713 is included. Therefore, the data derandomizer 1717 should perform the derandomization in consideration of the delay.

Figure 19:
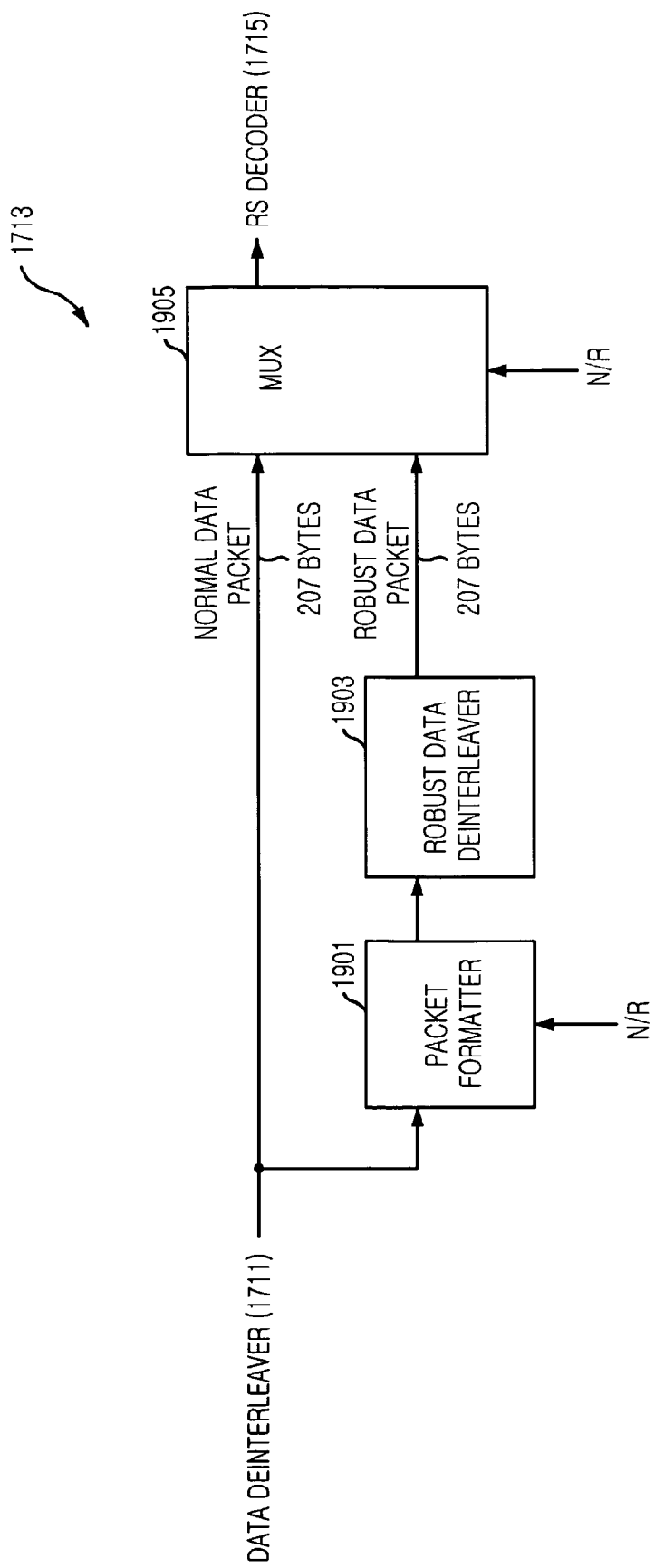
FIG. 19 is a block diagram describing a packet formatter and a robust deinterleaver of FIG. 17.
Figure 20:
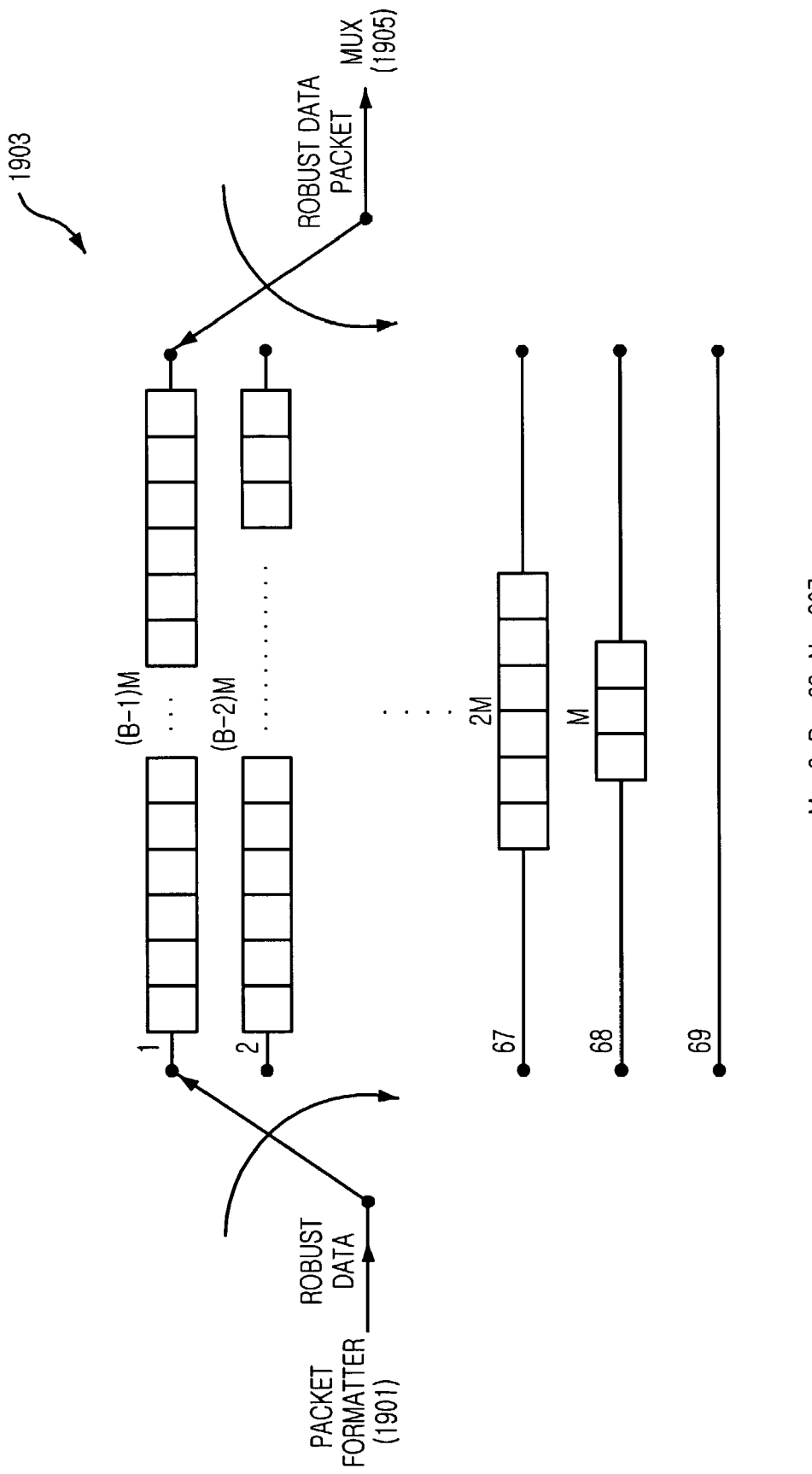
FIG. 20 is a diagram illustrating a robust data deinterleaver of FIG. 19.

FIG. 19 is a block diagram describing a packet formatter and a robust deinterleaver of FIG. 17, and FIG. 120 is a diagram illustrating a robust data deinterleaver of FIG. 19. The packet formatter and a robust data deinterleaver are operated in opposite to the robust interleaver/packet formatter 407 of the transmitter 400 illustrated in FIG. 5. That is, it removes RS parity (20 bytes) and header bytes (3 bytes) included in the robust data segment (207 bytes) inputted from the data deinterleaver 1711 and generates robust data packets including information data and null packets. Thus, when a robust data segment having 9 packets (9×207 bytes) is inputted into a packet formatter 1901, the packet formatter 1901 outputs four robust data packets which are formed of information data and five null packets formed of null data. Subsequently, a robust data deinterleaver 1903 receives the robust data packets inputted from the packet formatter 1901 on a byte basis, performs deinterleaving, and transmits the robust data packets to a multiplexer 1905. During the deinterleaving, null packets among the robust data packets are abandoned and the deinterleaving is carried out only on information packets. A normal data packet has a predetermined delay to be thereby multiplexed with a robust data packet.

The multiplexed normal data packet and robust data packet are transmitted to the RS decoder 1715. The RS decoder 1715 performs RS decoding with respect to each packet and transmits the resultant to the data derandomizer 1717.

With reference to FIG. 17 again, the demultiplexer 1719 demultiplexes the normal data packet and the robust data packet based on the robust data flag and outputs them in a form of a serial data stream formed of a 188-byte MPEG compatible data packet.

For the equalizer 1707, a known determiner, which is known as a slicer, or a trellis decoder with a trace back of zero (0) is used.

The equalizer 1707 equalizes a received signal based on the interleaved robust data flag obtained from the bit-unit data interleaving and the trellis interleaving based on the ATSC A/53 and transmitted from the controller 1725.

A robust data signal can be used as decision data used to update a tap coefficient of the equalizer 1707. Since precise signal level determination increases a convergence speed of the equalizer, it can improve reception performance for robust data as well as normal data in a Doppler environment.

The trellis decoder 1709 may be a trellis decoder based on the ATSC A/53 or it can be similar to the trellis decoder that can be used in the equalizer 1707. That is, with respect to a normal data signal, trellis decoding is carried out on an 8-level signal $\{-7,-5,-3,-1,1,3,5,7\}$, which is the same as the conventional technology. With respect to a robust data signal, trellis decoding is performed inversely according to the P-2VSB, E-4VSB or E-8VSB coding method used in the robust encoder 411.

According to the present invention, the 8-VSB receiver based on the ATSC A/53 can receive a normal data packet and it can provide backward compatibility by processing a robust data packet as a null packet.

While the present invention has been described with respect to certain preferred embodiments, it will be apparent to those skilled in the art that various changes and modifications may be made without departing from the scope of the invention as defined in the following claims.

What is claimed is:

1. A digital television (DTV) transmitter, comprising:
   an input unit configured to receive a digital video data stream including normal data and robust data;
   an encoding unit configured to code the digital video data stream into data symbols; and
   a transmitting unit configured to modulate and transmit an output signal of the encoding unit,
   wherein the encoding unit is configured to perform trellis coding on the robust data by sequentially mixing a plurality of methods such that the encoding unit includes a robust encoder configured to encode robust data by sequentially mixing a P-2VSB method with anyone method of an E-4VSB method and an E-8VSB method.

2. The DTV transmitter as recited in claim 1, wherein the encoding unit is configured to map the normal data into any one data symbol of $\{-7,-5,-3,-1,1,3,5,7\}$.

3. The DTV transmitter as recited in claim 1, wherein the encoding unit further includes:
   the robust encoder configured to code the robust data into 2-bit data symbols; and
   a trellis encoder configured to output a data symbol of any one level among predetermined levels expressed in three bits based on the 2-bit data symbols.

4. The DTV transmitter as recited in claim 1, wherein the robust encoder is configured to encode robust data by sequentially mixing the P-2VSB method only with the E-4VSB method.

5. The DTV transmitter as recited in claim 1, wherein the robust encoder is configured to encode robust data by sequentially mixing the P-2VSB method with the E-4VSB method and with the E-8VSB method.

6. The DTV transmitter as recited in claim 1, wherein the robust encoder is configured to encode robust data by sequentially mixing the P-2VSB method only with the E-8VSB method.

7. The DTV transmitter as recited in any one of claims 4 to 6, wherein the robust encoder maintains the distance of robust data packets encoded in the P-2VSB method to be not less than three packets.

8. The DTV transmitter as recited in any one of claims 1 to 6, wherein the encoding unit further includes:
   a data randomizer configured to randomize an output signal of the input unit;
   a Reed Solomon (RS) encoder configured to perform RS encoding on output signals of the data randomizer;
   a robust interleaver/packet formatter configured to interleave only robust data among output signals of the RS encoder and configured to perform reconstruction into robust data packets based on a robust data coding rate; and
   a data interleaver configured to interleave an output signal of the robust interleaver/packet formatter.

9. A digital television (DTV) receiver, comprising:
   a receiving unit configured to receive a transmission signal including normal data and robust data and configured to convert the received transmission signal into a baseband signal;
   an equalizing unit configured to determine a symbol level of the transmission signal;
   a trellis decoding unit configured to perform trellis decoding on the symbol whose level has been determined; and
   a decoding unit configured to output a digital video data stream with respect to the trellis decoded signal,
   wherein the trellis decoding unit configured to perform trellis decoding on the robust data by sequentially mixing a plurality of methods
   wherein the trellis decoding unit decodes the determined symbol level by sequentially mixing a P-2VSB method with anyone method of a E-4VSB method and an E-8VSB method.

10. The DTV receiver as recited in claim 9, wherein the trellis decoding unit is configured to decode the determined symbol level into two-bit data symbols by sequentially mixing the P-2VSB method only with the E-4VSB method.

11. The DTV receiver as recited in claim 9, wherein the trellis decoding unit is configured to perform decoding by further sequentially mixing the P2VSB method with the E-4VSB method and with the E-8VSB method.

12. The DTV receiver as recited in claim 9, wherein the trellis decoding the determined symbol level into a two-bit data symbol by sequentially mixing the P-2VSB method only with the E-8VSB method.

13. The DTV receiver as recited in any one of claims 9 to 12, wherein the decoding means includes:
   a data deinterleaver configured to deinterleave an output signal of the trellis decoding unit;
   a packet formatter/robust deinterleaver configured to reconstruct robust data among output signals of the data deinterleaver into robust data packets formed of information data and configured to deinterleave the reconstructed robust data packets;
   a Reed Solomon (RS) decoder configured to perform RS decoding on output signals of the packet formatter/robust deinterleaver;
   a data derandomizer configured to derandomize output signals of the RS decoder; and
   a demultiplexer configured to demultiplex output signals of the data derandomizer.

14. A digital television (DTV) transmitting method, comprising the steps of:
   a) inputting a digital video data stream including normal data and robust data;
   b) encoding robust data of the digital video data stream into data symbols by sequentially mixing a P-2VSB method with anyone method of an E-4VSB method and an E-8VSB method; and
   c) modulating and transmitting an output signal of the encoding step b),
   wherein trellis coding is performed on the robust data in the encoding step b) by sequentially mixing the plurality of methods.

15. The DTV transmitting method as recited in claim 14, wherein the normal data are mapped to any one data symbol of $\{-7,-5,-3,-1,1,3,5,7\}$ in the encoding step b).

16. The DTV transmitting method as recited in claim 14, wherein the encoding step b) includes:
   b1) encoding the robust data into 2-bit data symbols; and
   b2) outputting a data symbol of any one level among predetermined levels expressed in three bits based on the 2-bit data symbols, which is trellis encoding.

17. The DTV transmitting method as recited in claim 16, wherein the robust data are encoded by sequentially mixing the P-2VSB method only with the E-4VSB method in the robust encoding step b1).

18. The DTV transmitting method as recited in claim 16, wherein robust data are encoded by sequentially mixing the P-2VSB method with the E-4VSB method and with the E-8VSB method in the robust encoding step b1).

19. The DTV transmitting method as recited in claim 16, wherein robust data are encoded by sequentially mixing the P-2VSB method only with the E-8VSB method in the robust encoding step b1).

20. The DTV transmitting method as recited in any one of claims 17 to 19, wherein distance of robust data packets encoded in the P-2VSB method are maintained to be not less than three packets in the robust encoding step b1).

21. The DTV transmitting method as recited in any one of claims 14 to 19, wherein the encoding step b) further includes:
   b3) randomizing the input signal;
   b4) performing RS encoding on an output signal randomized in the step b3);
   b5) interleaving only robust data among output signals of the RS encoding step b4) and performing reconstruction into robust data packets based on a robust data coding rate, which is packet formatting; and
   b6) interleaving an output signal of the robust interleaving/packet formatting step b5).

22. The DTV transmitting method as recited in claim 16, wherein the DTV transmitting method transmits a digital television transmission signal comprising:
   normal data information mapped to any one data symbol of $\{-7,-5,-3,-1,1,3,5,7\}$;
   robust data information which are trellis encoded in P-2VSB, E-4VSB, and/or E-8VSB methods and mapped to any one data symbol of $\{-7,-5,-3,-1,1,3,5,7\}$;
   robust data trellis coding method information; and
   a robust data flag information for identifying the normal data and the robust data, wherein the transmission signal is a Vestigial Side Band (VSB) modulated signal.

23. The DTV transmitting method as recited in claim 22, wherein the, wherein the normal data information and the robust data information are interleaved to be mixed with each other, and the robust data information includes header information to have backward compatibility.

24. A digital television (DTV) receiving method, comprising the steps of:
   a) receiving a transmission signal including normal data and robust data and converting the received transmission signal into a baseband signal;
   b) determining a symbol level of the transmission signal;
   c) performing trellis decoding on the symbol whose level has been determined; and
   d) outputting a digital video data stream with respect to the trellis decoded signal,
   wherein the trellis decoding is performed on the robust data in the trellis decoding step c) by sequentially mixing a plurality of methods such that the trellis decoding step c) by sequentially mixes a P-2VSB method with anyone method of a E-4VSB method and an E-4VSB method.

25. The DTV receiving method as recited in claim 24, wherein the determined symbol level is decoded into a two-bit data symbol in the trellis decoding step c) by sequentially mixing the P-2VSB method only with the E-4VSB method.

26. The DTV receiving method as recited in claim 24, wherein the trellis decoding is performed in the trellis decoding step c) by by sequentially mixing the P-2VSB method with the E-4VSB method and with the E-8VSB method.

27. The DTV receiving method as recited in claim 24, wherein the determined symbol level is decoded into a two-bit data symbol in the trellis decoding step c) by sequentially mixing the P-2VSB method only with the E-8VSB method.

28. The DTV receiving method as recited in any one of claims 24 to 27, wherein the decoding step d) includes:
   d1) deinterleaving output signals of the trellis decoding step c);
   d2) reconstructing robust data among output signals obtained in the data deinterleaving step d1) into robust data packets formed of information data, which is packet formatting, and deinterleaving the reconstructed robust data packets;
   d3) performing Reed Solomon (RS) decoding on output signals of the packet formatting/robust deinterleaving step d2);
   d4) derandomizing output signals of the RS decoding step d3); and
   d5) demultiplexing output signals of the data derandomizing step d4).

* * * * *